United States Patent
Lin et al.

(10) Patent No.: US 11,942,363 B2
(45) Date of Patent: *Mar. 26, 2024

(54) METHODS FOR FORMING STACKED LAYERS AND DEVICES FORMED THEREOF

(71) Applicant: Taiwan Semiconductor Manufacturing Co., Ltd., Hsinchu (TW)

(72) Inventors: Shih-Yao Lin, New Taipei (TW); Kuei-Yu Kao, Hsinchu (TW); Chen-Ping Chen, Toucheng Township (TW); Chih-Han Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/818,608

(22) Filed: Aug. 9, 2022

(65) Prior Publication Data

US 2022/0384263 A1    Dec. 1, 2022

Related U.S. Application Data

(63) Continuation of application No. 16/870,389, filed on May 8, 2020, now Pat. No. 11,488,858.
(Continued)

(51) Int. Cl.
*H01L 21/76*  (2006.01)
*H01L 21/306* (2006.01)
(Continued)

(52) U.S. Cl.
CPC .. *H01L 21/76831* (2013.01); *H01L 21/30608* (2013.01); *H01L 21/30655* (2013.01);
(Continued)

(58) Field of Classification Search
CPC ......... H01L 21/76831; H01L 21/30608; H01L 21/30655; H01L 21/823412;
(Continued)

(56) References Cited

U.S. PATENT DOCUMENTS 9,478,600 B2    10/2016    Wang et al.
9,634,007 B2    4/2017    Pillarisetty et al.
(Continued)

FOREIGN PATENT DOCUMENTS

DE    102018105996 A1    2/2019
KR    20090012583 A    2/2009
(Continued)

OTHER PUBLICATIONS

Takenaka, et al., "Anisotropic deposition of copper of H-assisted plasma chemical vapor deposition," Materials Science in Semiconductor Processing, vol. 5, 2003, pp. 301-304.
(Continued)

*Primary Examiner* — Duy Vu N Deo
(74) *Attorney, Agent, or Firm* — Slater Matsil, LLP

(57) ABSTRACT

A method includes etching a semiconductor substrate to form a trench, with the semiconductor substrate having a sidewall facing the trench, and depositing a first semiconductor layer extending into the trench. The first semiconductor layer includes a first bottom portion at a bottom of the trench, and a first sidewall portion on the sidewall of the semiconductor substrate. The first sidewall portion is removed to reveal the sidewall of the semiconductor substrate. The method further includes depositing a second semiconductor layer extending into the trench, with the second semiconductor layer having a second bottom portion over the first bottom portion, and a second sidewall portion
(Continued)

contacting the sidewall of the semiconductor substrate. The second sidewall portion is removed to reveal the sidewall of the semiconductor substrate.

20 Claims, 36 Drawing Sheets

Related U.S. Application Data

(60) Provisional application No. 62/927,547, filed on Oct. 29, 2019.

(51) Int. Cl.
*H01L 21/3065* (2006.01)
*H01L 21/768* (2006.01)
*H01L 21/8234* (2006.01)
*H01L 27/088* (2006.01)
*H01L 21/02* (2006.01)

(52) U.S. Cl.
CPC ........ *H01L 21/823412* (2013.01); *H01L 21/823431* (2013.01); *H01L 27/0886* (2013.01); *H01L 21/02236* (2013.01); *H01L 21/02247* (2013.01); *H01L 21/02381* (2013.01); *H01L 21/0243* (2013.01); *H01L 21/0245* (2013.01); *H01L 21/02488* (2013.01); *H01L 21/02507* (2013.01); *H01L 21/02532* (2013.01); *H01L 21/3065* (2013.01)

(58) Field of Classification Search
CPC ......... H01L 21/823431; H01L 27/0886; H01L 21/02236; H01L 21/02247; H01L 21/02381; H01L 21/0243; H01L 21/0245; H01L 21/02488; H01L 21/02507; H01L 21/02532; H01L 21/3065; H01L 21/02447; H01L 21/02505; H01L 29/0673; H01L 29/42392; H01L 29/66439; H01L 29/775; H01L 29/78696; B82Y 10/00
USPC ................................................. 438/689–714
See application file for complete search history.

(56) References Cited

U.S. PATENT DOCUMENTS

| | | | |
|---|---|---|---|
| 10,784,106 B2 | 9/2020 | Huang et al. | |
| 10,811,502 B1 | 10/2020 | Khemka et al. | |
| 11,488,858 B2* | 11/2022 | Lin | ................... H01L 29/42392 |
| 2010/0123220 A1* | 5/2010 | Burke | ................... H01L 29/407 |
| | | | 257/E21.294 |
| 2014/0154849 A1 | 6/2014 | Wang et al. | |
| 2015/0037970 A1 | 2/2015 | Hasebe et al. | |
| 2019/0006492 A1 | 1/2019 | Wang et al. | |
| 2019/0109004 A1 | 4/2019 | Huang et al. | |
| 2020/0044095 A1* | 2/2020 | Wang | ............... H01L 29/66742 |

FOREIGN PATENT DOCUMENTS

| | | | | |
|---|---|---|---|---|
| KR | 20110108220 A | * | 10/2011 | ............. H10B 41/27 |
| KR | 20150038419 A | | 4/2015 | |
| KR | 20170136961 A | * | 10/2017 | ......... H01L 29/4232 |

OTHER PUBLICATIONS

"What in the world is Engimatics? CVD of Titanium Nitride and Other Battier Metals," Titanium NItride, Apr. 22, 2021, 7 pages.

* cited by examiner

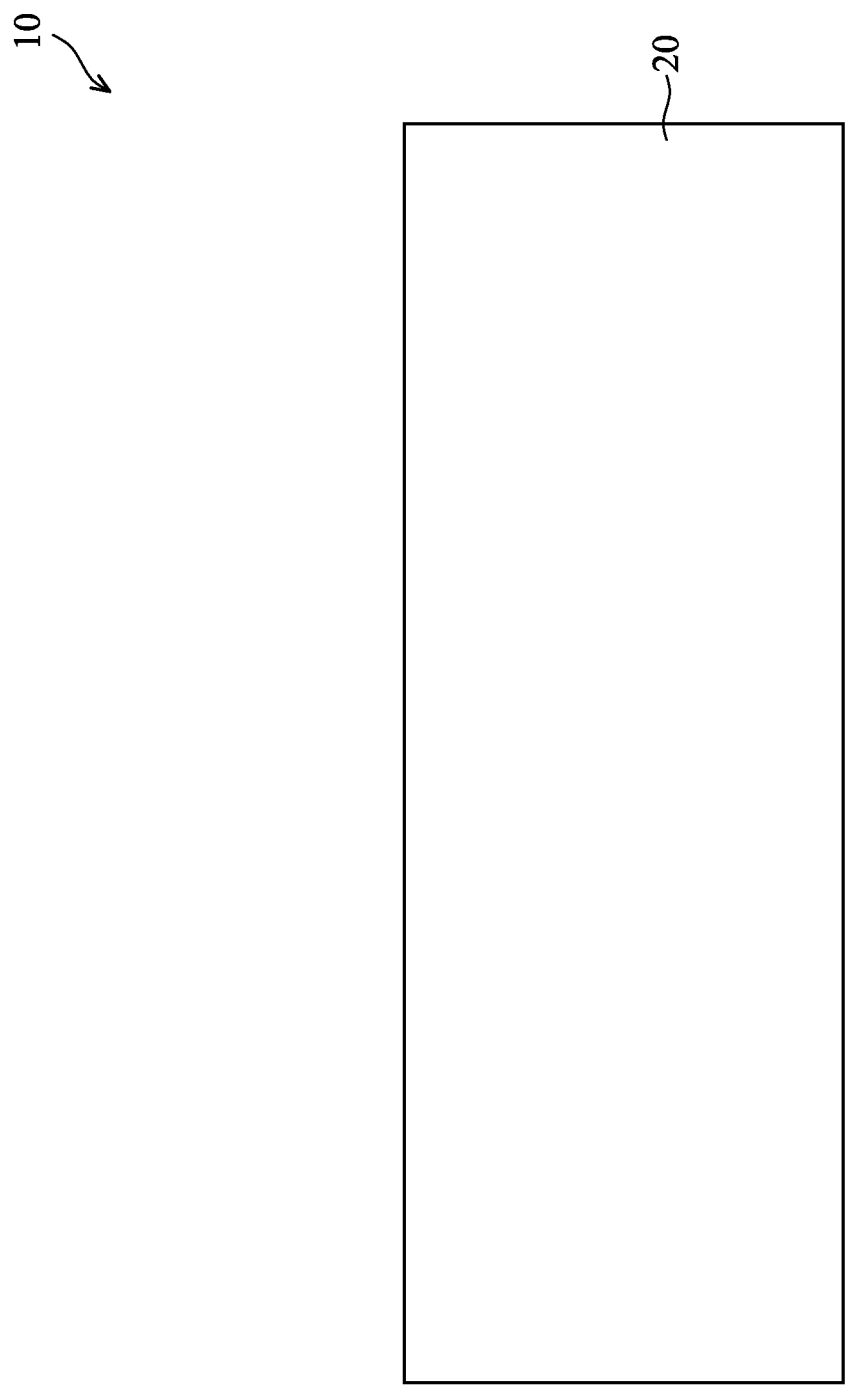

METHODS FOR FORMING STACKED LAYERS AND DEVICES FORMED THEREOF

PRIORITY CLAIM AND CROSS-REFERENCE

This application is a continuation of U.S. patent application Ser. No. 16/870,389, filed on May 8, 2020, and entitled "Methods for Forming Stacked Layers and Devices Formed Thereof," which claims the benefit of the U.S. Provisional Application No. 62/927,547, filed Oct. 29, 2019, and entitled "Methods for Improving Transistor with Hybrid Design and Resulting Structures," which applications are hereby incorporated herein by reference.

BACKGROUND

In the formation of integrated circuits, to suit to the design of different circuits, a plurality of devices may be integrated on a same chip. For example, FinFET transistors, nano-sheet transistors, Gate-All-Around (GAA) transistors, and the like, may be formed on the same chip. Interface regions are used to separate the different types of devices. To improve the overall density of the devices on the chip, the occupied chip area of the interface regions need to be reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
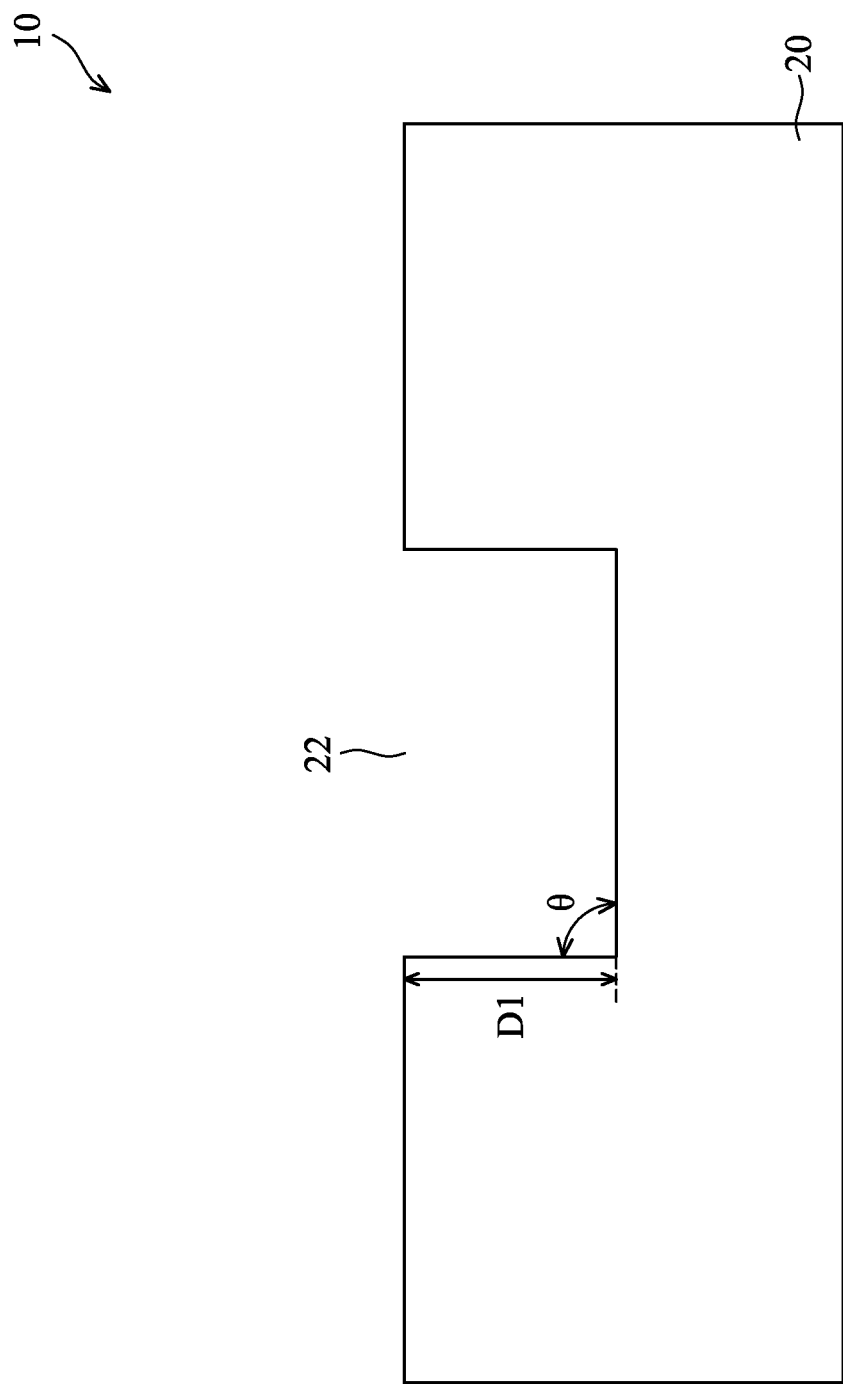
FIGS. 1 through 17, 18A, 18B-1 and 18B-2 illustrate the cross-sectional views of intermediate stages in the formation of stacked layers and transistors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Stacked layer formed of different materials and the method of forming the same are provided in accordance with some embodiments. The intermediate stages in the formation of the stacked layers are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In accordance with some embodiments of the present disclosure, the formation of stacked layers include forming a trench, depositing a first conformal layer formed of a first material, removing the vertical portions of the first conformal layer while leaving the horizontal portions of the first conformal layer un-removed, depositing a second conformal layer formed of a second material, and removing the vertical portions of the second conformal layer while leaving the horizontal portions of the second conformal layer un-removed. The resulting layers of the first material and the second material include the horizontal portions, but not the vertical portions, in the trench. Since the vertical portions would have occupied chip area, by removing the vertical portions, the interface area of the stacked layers is reduced. It is appreciated that although the subsequent discussed layers 24 and 34 are semiconductor layers in some embodiments, these layers may also be formed of other materials such as dielectric materials, metallic materials, or the like.

Figure 34:
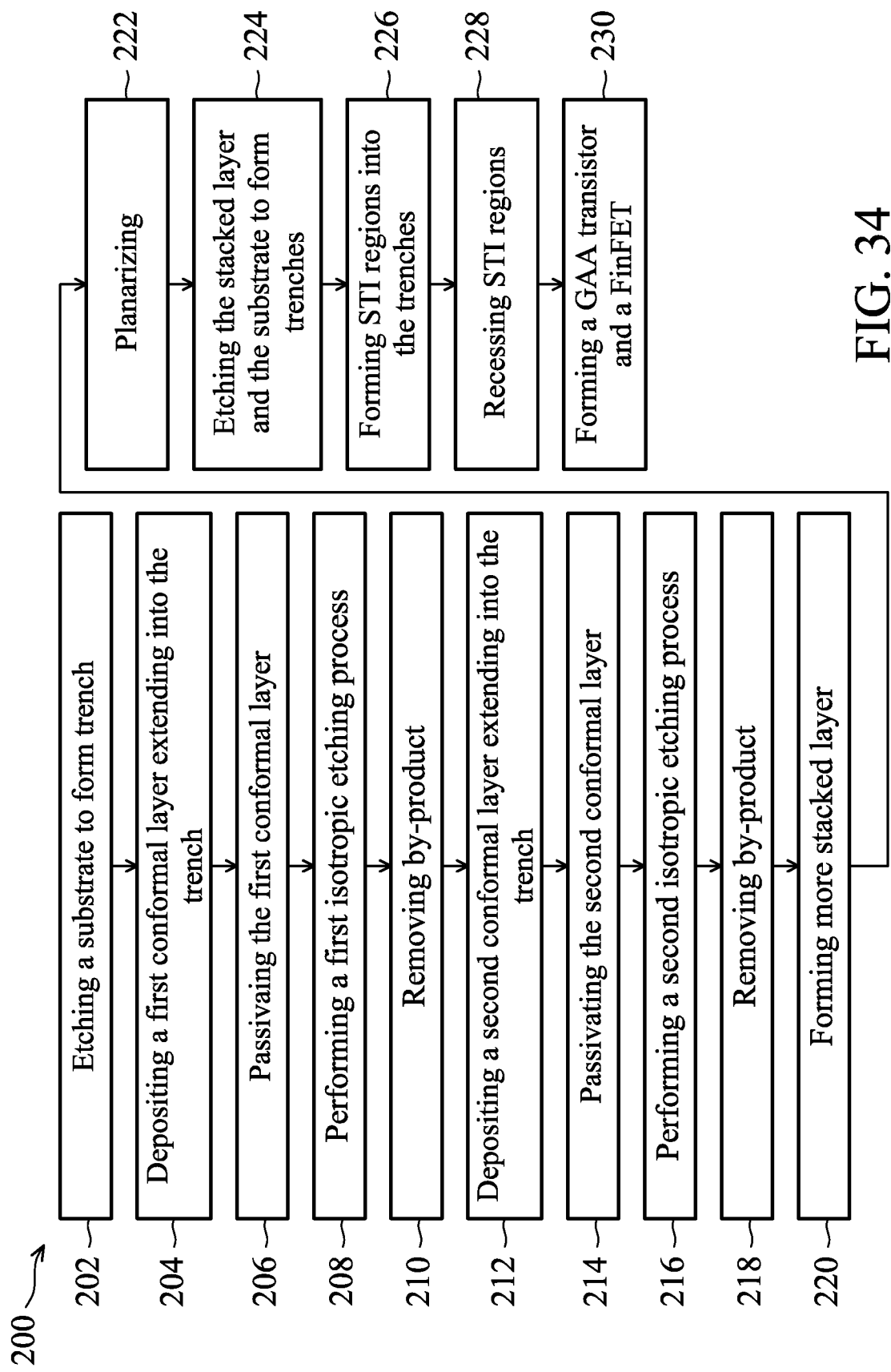
FIG. 34 illustrates a process flow for forming stacked layers and a Gate-All-Around (GAA) transistor based on the stacked layers in accordance with some embodiments.

FIGS. 1 through 17, 18A, 18B-1 and 18B-2 illustrate the cross-sectional views of intermediate stages in the formation of stacked layers and a Gate-All-Around (GAA) transistor in accordance with some embodiments of the present disclosure. The corresponding processes are also reflected schematically in the process flow 200 as shown in FIG. 34.

Figure 18A:
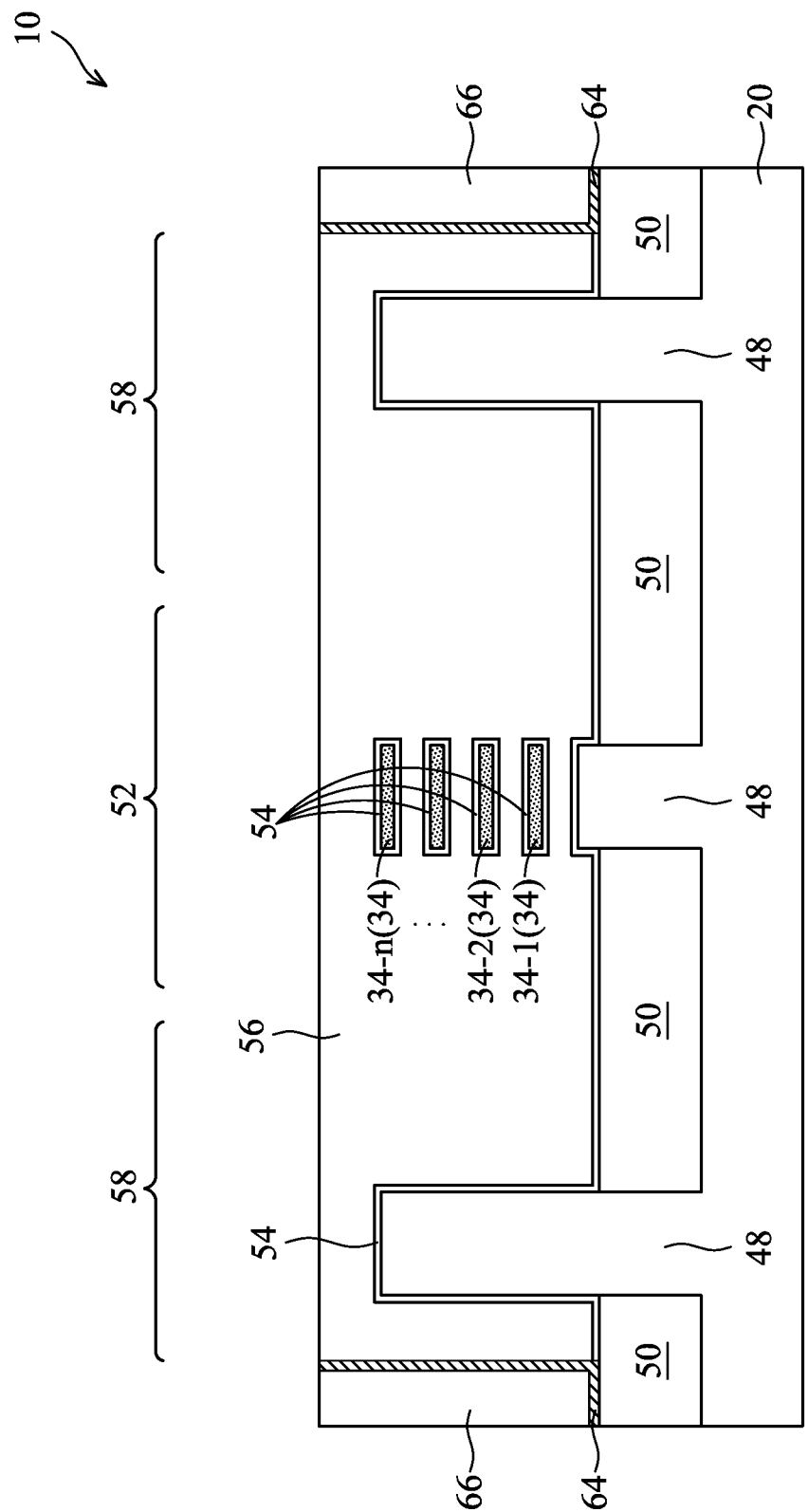
Figures 1, 18B:
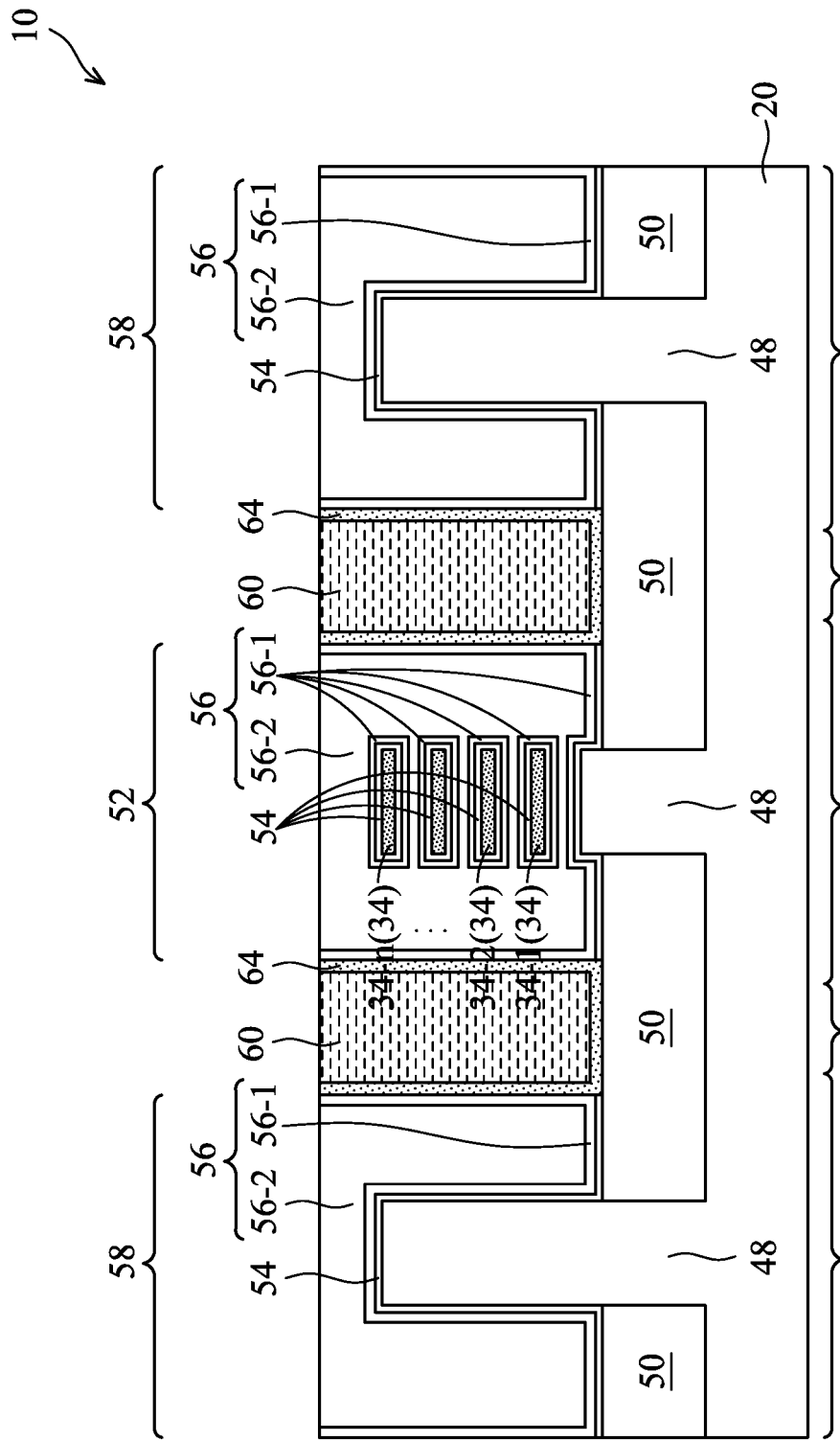

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Referring to FIG. 2, trench 22 is formed. The respective process is illustrated as process 202 in the process flow 200 shown in FIG. 34. In accordance with some embodiments, the etching is performed using an anisotropic etching process. For example, when substrate 20 is formed of or comprise silicon, the etching is performed using a dry etching method, and the etching gas may include $C_2F_6$, $CF_4$, $SO_2$, the mixture of HBr, $Cl_2$, and $O_2$, the mixture of HBr, $Cl_2$, $O_2$, and $CF_2$, or the like. The depth D1 of trench 22 is related to the desirable number of channel layers. In accordance with some embodiments, depth D1 of trench 22 is in the range between about 10 nm and about 200 nm. The resulting trench 22 may have vertical sidewalls as shown in FIG. 2, with tilt angle θ being equal to 90 degrees or substantially equal to 90 degrees, for example, in the range between about 89° and about 91°. The tilt angle θ may also be smaller than 89°, for example, in the range between about 85° and about 89°, or greater than about 91°, for example, in the range between about 91° and about 110°. Tilt angle θ may also be smaller than about 85° or greater than about 110°.

Figure 3:
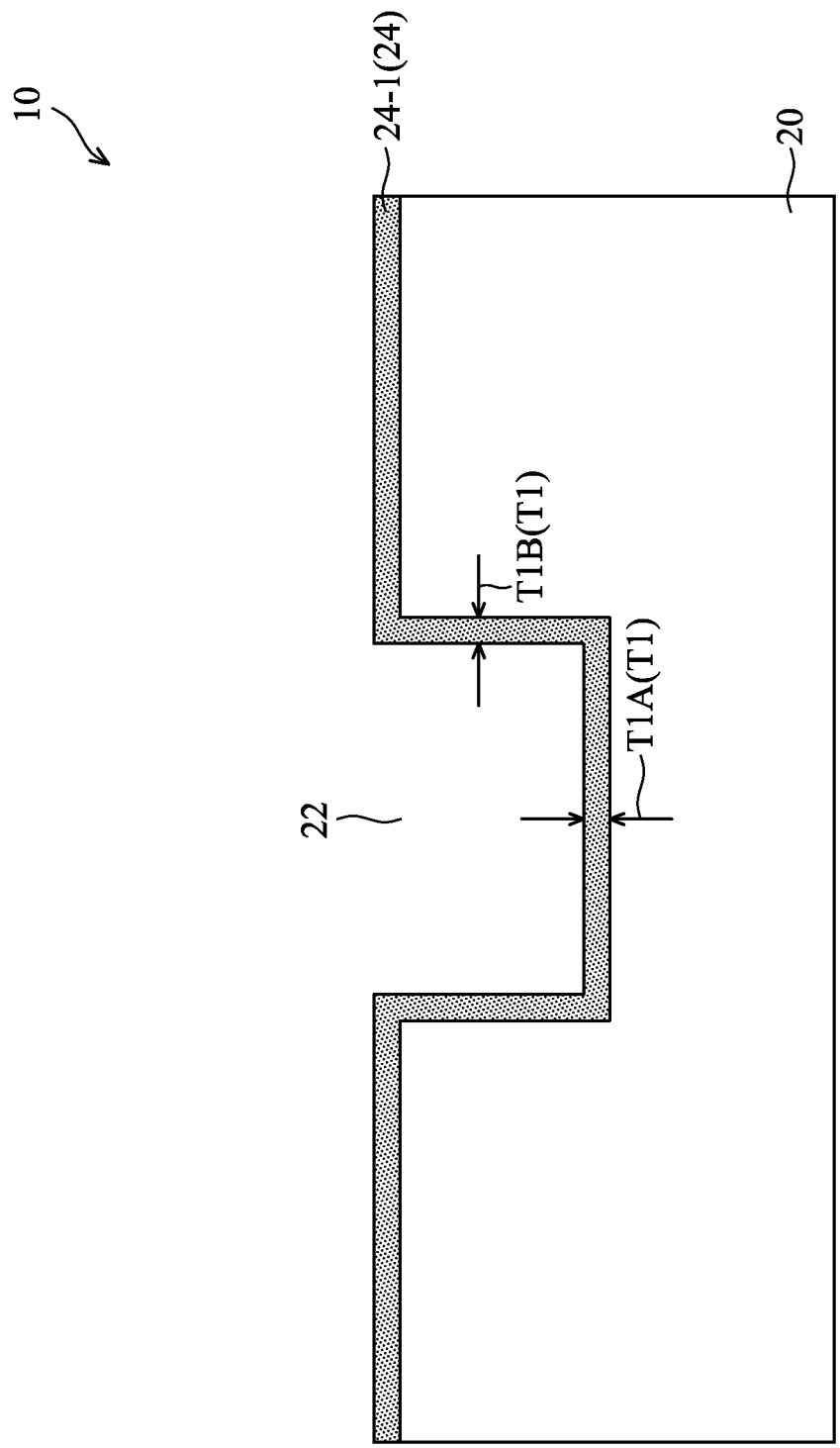

FIGS. 3 through 6 illustrate the formation of semiconductor layer 24-1 and passivation layer 28-1 in accordance with some embodiments of the present disclosure. Throughout the description, semiconductor layers 24-1 through 24-$n$ (FIG. 13) are also collectively and individually referred to as semiconductor layers 24, and passivation layers 28-1 through 28-$n$ (FIG. 13) are also collectively and individually referred to as passivation layers 28. FIG. 3 illustrates the deposition of semiconductor layer 24-1. The respective process is illustrated as process 204 in the process flow 200 shown in FIG. 34. Semiconductor layer 24-1 may be formed of a material different from the material of substrate 20. In accordance with some embodiments, semiconductor layer 24-1 is a semiconductor layer formed of or comprising SiGe, germanium (free or substantially free from silicon, for example, with Si atomic percentage being lower than about 10 percent), SiC, or other materials. In accordance with some embodiments in which SiGe is used, the germanium atomic percentage may be in the range between about 30 percent and about 60 percent. Higher or lower atomic percentages of germanium are also in the scope of the present disclosure. In accordance with some embodiments, the deposition includes an epitaxial growth. In accordance with some embodiments, for example, when GAA transistors are to be formed, semiconductor layers 24-1 through 24-$n$ (FIG. 13) may be removed in subsequent processes, and are thus referred to as sacrificial layers. In accordance with other embodiments, semiconductor layers 24 are not removed, and may be left in the final structure.

The deposition may be performed using a conformal deposition method, which may include Atomic Layer Deposition (ALD), Plasma Enhanced Atomic Layer Deposition (PEALD), Chemical Vapor Deposition (CVD), Plasma Enhanced Chemical Vapor Deposition (PECVD), Physical Vapor Deposition (PVD), or the like. Accordingly, semiconductor layer 24-1 may be a conformal layer, with horizontal thickness T1A and vertical thickness T1B being equal to each other or substantially equal to each other. For example, the horizontal thickness T1A and vertical thickness T1B may have a difference smaller than about 20 percent. In accordance with some embodiments, the thicknesses T1 (including T1A and T1B) may be in the range between about 3 nm and about 100 nm, while other thickness ranges are also contemplated.

Figure 4:
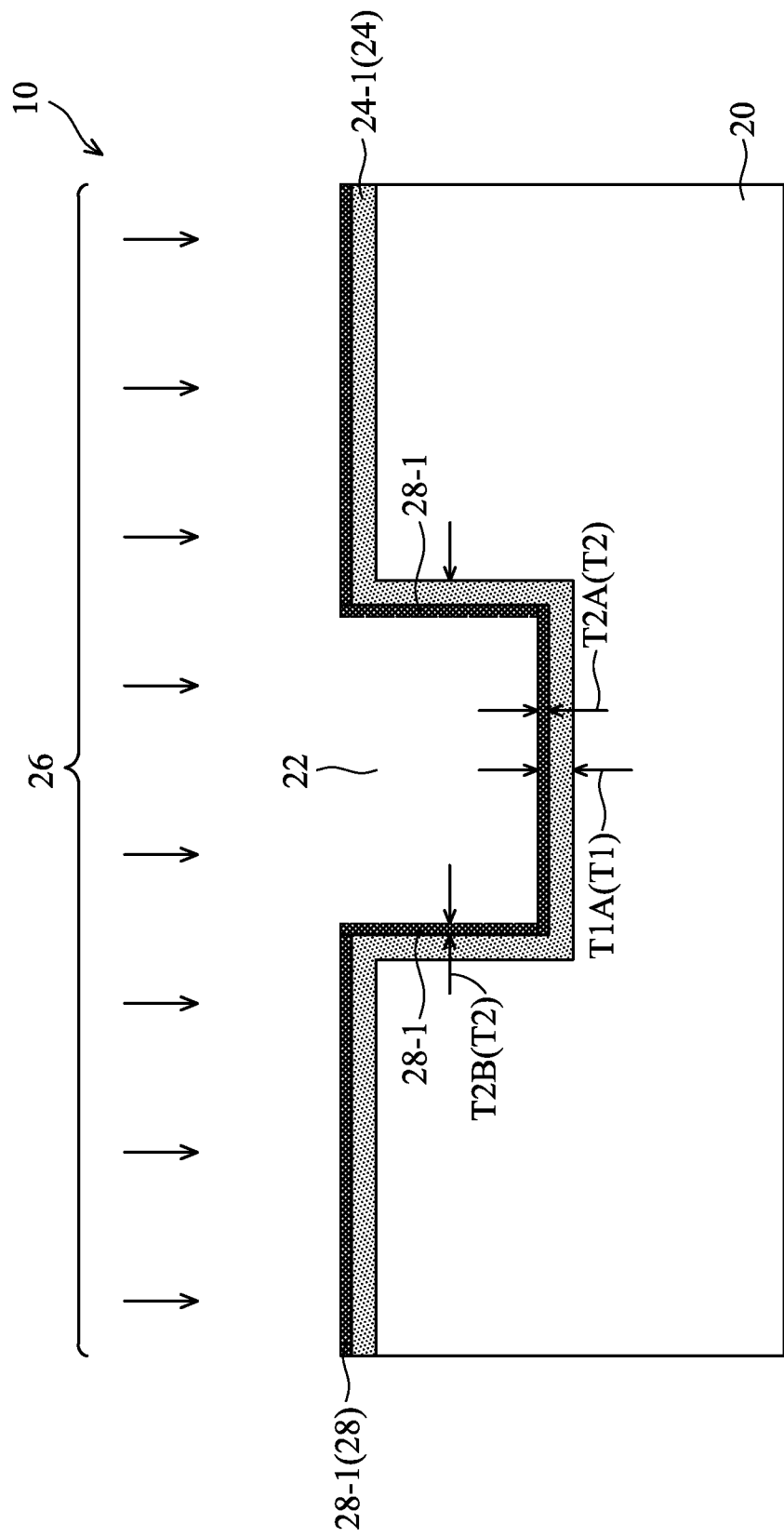

Next, referring to FIG. 4, passivation process 26 is performed, in which a process gas is used to passivate a surface layer of a horizontal portion of semiconductor layer 24-1, so that it has an increased etching selectivity in the subsequent etching process. The respective process is illustrated as process 206 in the process flow 200 shown in FIG. 34. The process gas may include nitrogen ($N_2$), oxygen ($O_2$), $SO_2$, $CH_4$, $CO_2$, CO, $SiCl_4$, or combinations thereof. Other gases such as Ar, He, or the like, may also be added into the process gas. The process gas modifies/treats the top surface layer of semiconductor layer 24-1, and the modified surface layer is referred to as passivation layer 28-1. When the process gas comprises oxygen, the surface layer of semiconductor layer 24-1 is oxidized, and passivation layer 28-1 is an oxygen-containing layer. When the process gas comprises nitrogen, the surface layer of semiconductor layer 24-1 is nitrided, and passivation layer 28-1 is a nitrogen-containing layer. Accordingly, passivation layer 28-1 includes the elements of semiconductor layer 24-1 and additional elements from the process gas, and has the property different from the underlying un-treated portion of semiconductor layer 24-1.

In accordance with some embodiments of the present disclosure, the passivation is performed through an anisotropic process, so that the surface layer of the horizontal portions of semiconductor layer 24-1 is passivated to form passivation layer 28-1, while no passivation layer is formed on the vertical portions of semiconductor layer 24-1. In accordance with some embodiments of the present disclosure, the thickness T2 (including T2A and T2B) of the passivation layer is smaller than about 15 percent of thickness T1 of semiconductor layer 24-1, and ratio T2/T1 is smaller than 0.2, and may be in the range between about 0.05 and about 0.2. In accordance with alternative embodiments, the treatment process includes both of a vertical component and a horizontal component, with the vertical component being greater than the horizontal component. As a result, when the passivation layer 28-1 is formed on the horizontal portions of semiconductor layers 24-1, thinner vertical portions of passivation layers 28-1 are also formed on the vertical portions of semiconductor layer 24-1. The vertical portions of the passivation layer 28-1 are shown using dashed lines to indicate they may or may not be formed. The vertical portions of passivation layer 28-1 may have thicknesses T2B smaller than about 50 percent, or smaller than about 30 percent or 20 percent, of the thicknesses T2A of the horizontal portions.

In accordance with some embodiments of the present disclosure, the passivation process is performed with a source power in a range between about 10 watts and about 4,000 watts. The bias power may be in the range between about 10 watts and about 4,000 watts, so that adequate anisotropic effect is generated. The pressure of the process gas may be in the range between about 1 mTorr and about 800 mTorr. The flow rate of the process gas may be in the range between about 1 sccm and about 5,000 sccm.

Figure 5:
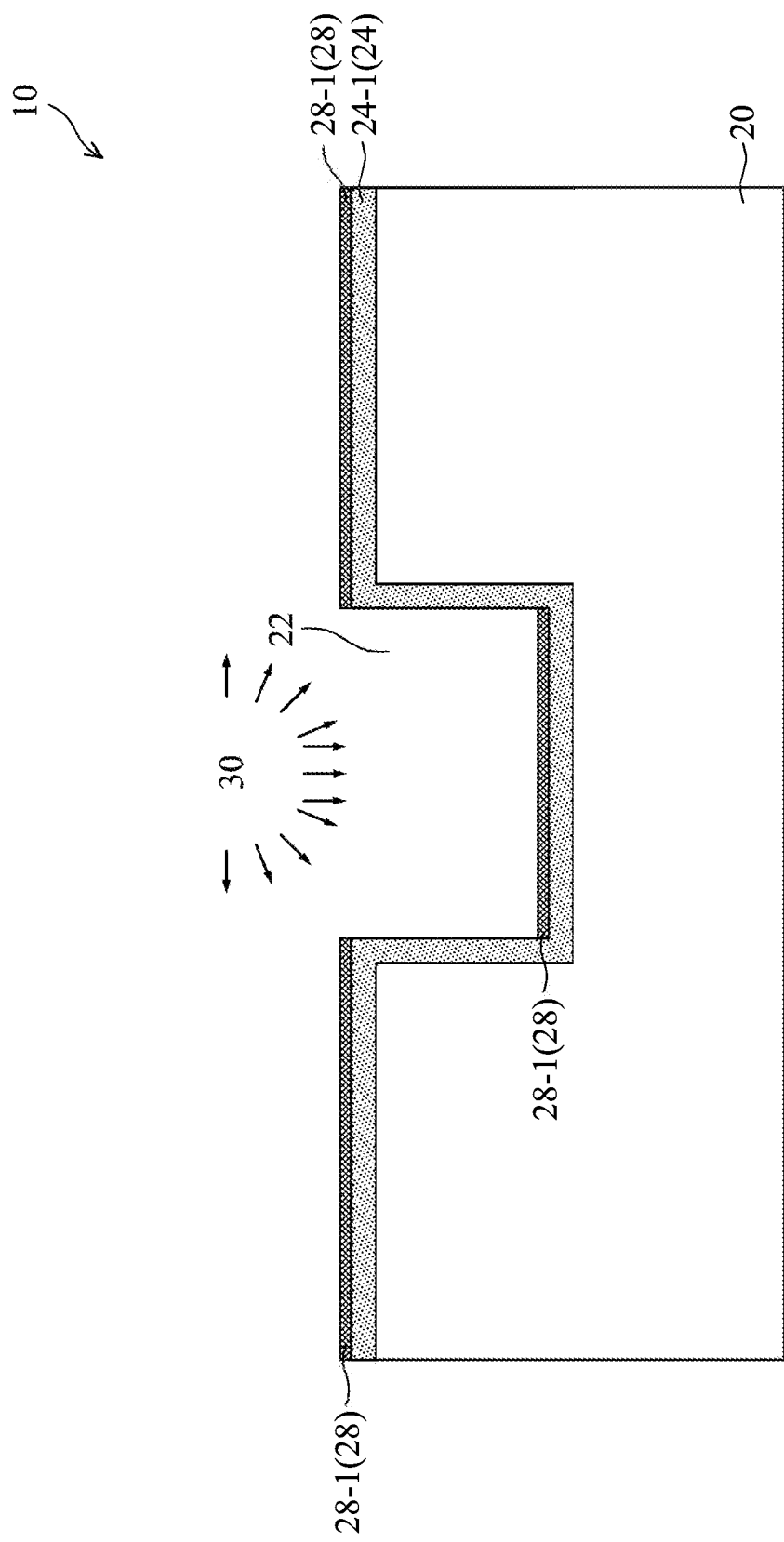

FIG. 5 illustrates an etching process 30, which may be an isotropic etching process. The respective process is illustrated as process 208 in the process flow 200 shown in FIG. 34. The etching process is performed using an etching gas that etches semiconductor layer 24-1, and does not etch passivation layer 28-1. The etching gas may include $Cl_2$, HBr, $CF_4$, $CHF_3$, $CH_2F_2$, $CH_3F$, $C_4F_6$, or combinations thereof. Dilute gases such as Ar, He, Ne, or the like, may also be added into the etching gas. In the etching process 30, plasma may be turned on.

In accordance with some embodiments of the present disclosure, the etching process 30 is performed with a source power in a range between about 10 watts and about 4,000 watts. There may not be bias power applied (with bias power equal to 0 watts), or the bias power is very low, for example, lower than about 0.5 watts. The pressure of the etching gas may be in the range between about 1 mTorr and about 800 mTorr. The flow rate of the etching gas may be in the range between about 1 sccm and about 5,000 sccm.

Figure 6:
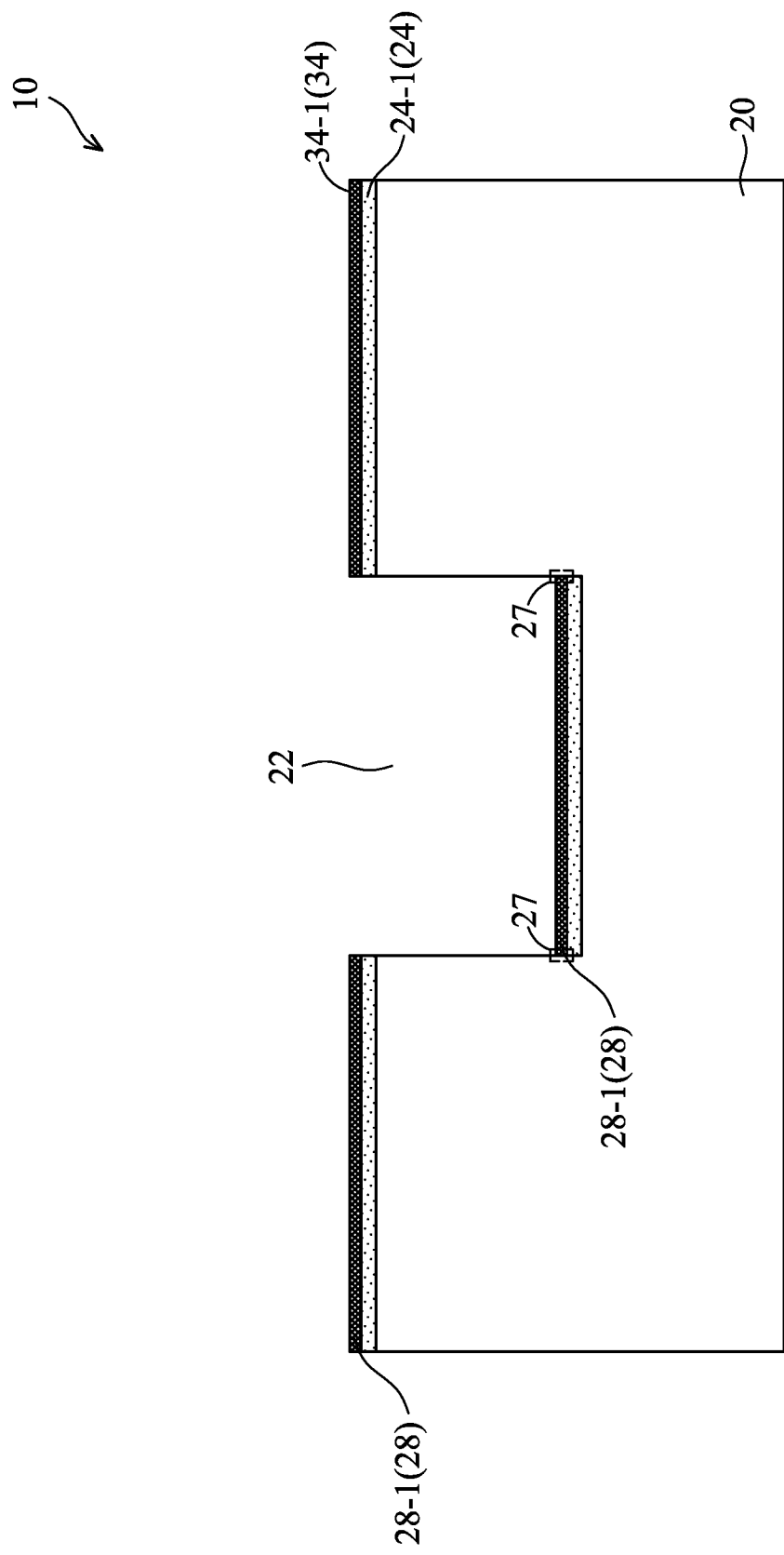

In the etching process 30, the etching selectivity, which is the ratio of the etching rate of semiconductor layer 24-1 to the etching rate of passivation layer 28-1, is higher than 3, may be higher than about 5, and may be in the range between about 3 and about 50. The horizontal portions of semiconductor layer 24-1 are protected by passivation layer 28-1, and are not etched. On the other hand, the vertical portions of semiconductor layer 24-1 are etched. When passivation layer 28-1 is also formed on the vertical portions of semiconductor layer 24-1, since the vertical portions of passivation layer 28-1 are thinner than the horizontal portions of passivation layer 28-1, the vertical portions will be consumed (at a low etching rate) earlier than the horizontal portions, and then the exposed vertical portions of semiconductor layer 24-1 are etched. The resulting structure is shown in FIG. 6, in which the sidewalls of substrate 20 are exposed. It is appreciated that when passivation layer 28-1 does not include vertical portions, passivation layer 28-1 may still extend to the sidewalls of substrate 20 since the vertical portions of semiconductor layer 24-1 (which are etched) are thin. Alternatively, passivation layer 28-1 may be spaced apart from the sidewalls of substrate 20, and regions 27 do not have passivation layer 28-1. In the resulting structure as shown in FIG. 6, semiconductor layer 24-1 extends to the sidewalls of substrate 20, while there are no vertical portions of semiconductor layer 24-1 remaining. The sidewalls of substrate 20 facing trench 22 are thus revealed again.

In accordance with some embodiments of the present disclosure, in the etching process 30, a byproduct (not shown) may be generated, which may be accumulated in trench 22, and may be formed on top of sacrificial layer 28-1. The byproduct is related to the composition of semiconductor layer 24-1 and the etching gas. For example, the byproduct may include $SiO_xCl_y$ in accordance with some embodiments. The byproduct is removed, for example, using a chemical solution including $H_2SO_4$, $HNO_3$, $NH_3$, HF, HCl, or combinations thereof. The respective process is illustrated as process 210 in the process flow 200 shown in FIG. 34. Gases such as $O_3$, $H_2$, or the like may be added into the chemical solution. The solvent of the chemical solution may include water, alcohol, or the like.

Figure 7:
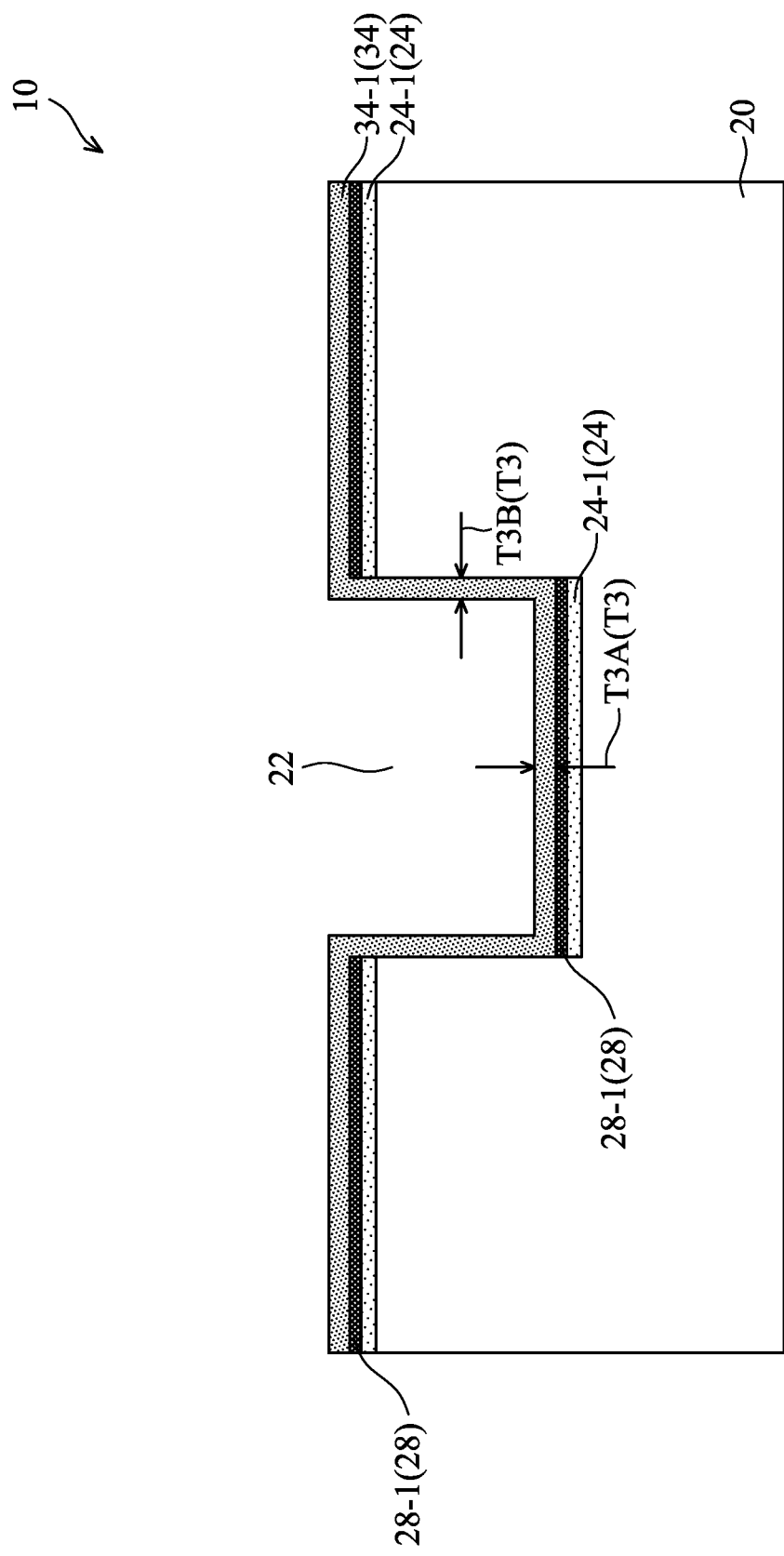

FIGS. 7 through 10 illustrate the formation of semiconductor layer 34-1 and passivation layer 38-1 in accordance with some embodiments of the present disclosure. Throughout the description, semiconductor layers 34-1 through 34-n (FIG. 13) are collectively and individually referred to as semiconductor layers 34, and passivation layers 38-1 through 38-n (FIG. 13) are also collectively and individually referred to as passivation layers 38. FIG. 7 illustrates the deposition of semiconductor layer 34-1. The respective process is illustrated as process 212 in the process flow 200 shown in FIG. 34. Semiconductor layer 34-1 is formed of a semiconductor material different from the material of semiconductor layer 24-1. In accordance with some embodiments, semiconductor layer 34-1 is formed of or comprises silicon (free from germanium), silicon germanium, or the like. When both of semiconductor layers 24-1 and 34-1 comprise silicon germanium, the germanium percentage of semiconductor layer 34-1 may be lower than (for example, by around a half) the germanium percentage of semiconductor layer 24-1. In accordance with some embodiments in which SiGe is used, the germanium atomic percentage may be lower than about 40 percent, lower than about 20 percent, or lower than about 10 percent. Semiconductor layers 34 may be used as a channel layer of the resulting GAA transistor in accordance with some embodiments, and hence are also referred to as channel semiconductor layers 34.

The deposition of semiconductor layer 34-1 may be performed using a conformal deposition method, which may include ALD, PEALD, PECVD, PVD, or the like. Accordingly, semiconductor layer 34-1 may be a conformal layer, with horizontal thickness T3A and vertical thickness T3B being equal to each other or substantially equal to each other, for example, with a difference smaller than about 20 percent. In accordance with some embodiments, the thicknesses T3 (including T3A and T3B) may be in the range between about 3 nm and about 100 nm, while other thickness ranges are also contemplated.

Figure 8:
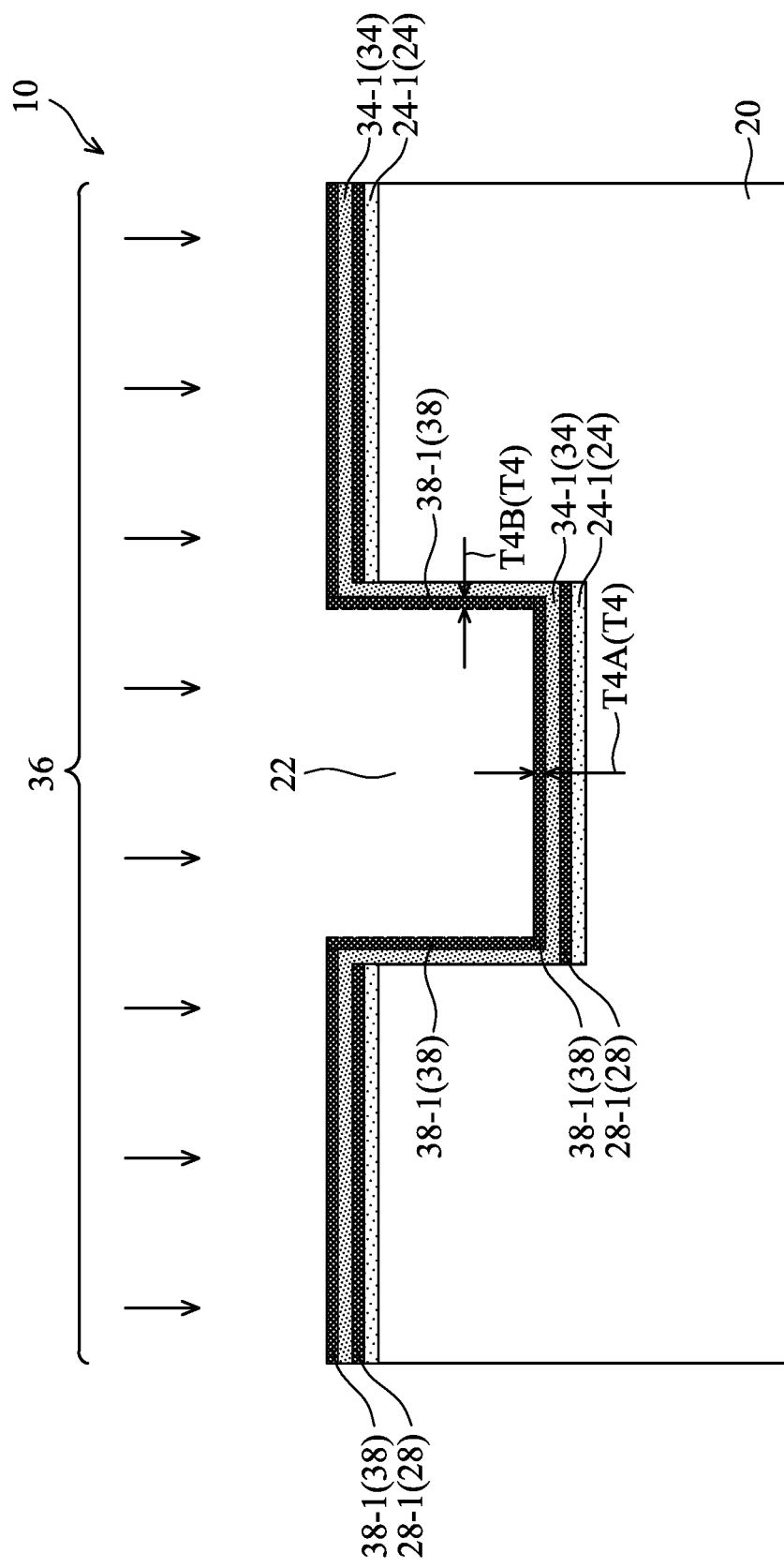

Next, referring to FIG. 8, passivation process 36 is performed, in which a process gas is used to passivate a surface layer of semiconductor layer 34-1, so that it has an increased etching selectivity in the subsequent etching process. The respective process is illustrated as process 214 in the process flow 200 shown in FIG. 34. The process gas may also include nitrogen ($N_2$), oxygen ($O_2$), $SO_2$, $CH_4$, $CO_2$, CO, $SiCl_4$, or combinations thereof. Other gases such as Ar, He, or the like, may also be added into the process gas. In accordance with some embodiments of the present disclosure, while both of passivation process 26 (FIG. 4) and passivation process 36 (FIG. 8) may be performed using process gases selected from the same group of process gases, the processes may be the same or different from each other. Furthermore, even if the process gases for passivation processes 26 and 36 are the same as each other, for example, all comprising oxygen, the amount of some gases may be tuned to achieve higher etching selectivity in the etching of the respective vertical portions. For example, when semiconductor layer 24-1 comprises SiGe, and semiconductor layer 34-1 comprises Si and is free from Ge, passivation process 36-1 may be performed with a higher flow rate of the process gas than the passivation process 26 when the process gas comprises $O_2$. The passivated surface layer of semiconductor layer 34-1 is referred to as passivation layer 38-1. When the process gas comprises oxygen, the surface layer of semiconductor layer 34-1 is oxidized, and passivation layer 38-1 is an oxygen-containing layer. When the process gas comprises nitrogen, the surface layer of semiconductor layer 34-1 is nitrided, and passivation layer 38-1 is a nitrogen-containing layer. Accordingly, passivation layer 38-1 has the property different from the underlying un-treated portion of semiconductor layer 34-1.

In accordance with some embodiments of the present disclosure, the passivation process is an anisotropic process, so that the surface layer of the horizontal portions of semiconductor layer 34-1 is passivated to form passivation layer 38-1, while no passivation layer is formed on the vertical portions of semiconductor layer 34-1. In accordance with some embodiments of the present disclosure, the thickness T4 of the passivation layer 38-1 is smaller than about 15 percent of thickness T3 of semiconductor layer 34-1, and ratio T4/T3 may be in the range between about 0.05 and about 0.2. In accordance with alternative embodiments, the treatment process includes both of a vertical component and a horizontal component, with the vertical component being greater than the horizontal component. As a result, when passivation layer 38-1 is formed on the horizontal portion of semiconductor layers 34-1, a thinner vertical portion of the passivation layer 38-1 is formed on the vertical portions of semiconductor layer 34-1. The vertical portions of the passivation layer 38-1 are shown using dashed lines to indicate they may or may not be formed. The vertical portions of passivation layer 38-1 may have thicknesses T4B smaller than about 50 percent, 20 percent, or 10 percent of the thicknesses T4A of the horizontal portions.

In accordance with some embodiments of the present disclosure, the passivation process 36-1 is performed with a source power in a range between about 10 watts and about 4,000 watts. The bias power may be in the range between about 10 watts and about 4,000 watts. The pressure of the process gas may be in the range between about 1 mTorr and about 800 mTorr. The flow rate of the process gas may be in the range between about 1 sccm and about 5,000 sccm.

Figure 9:
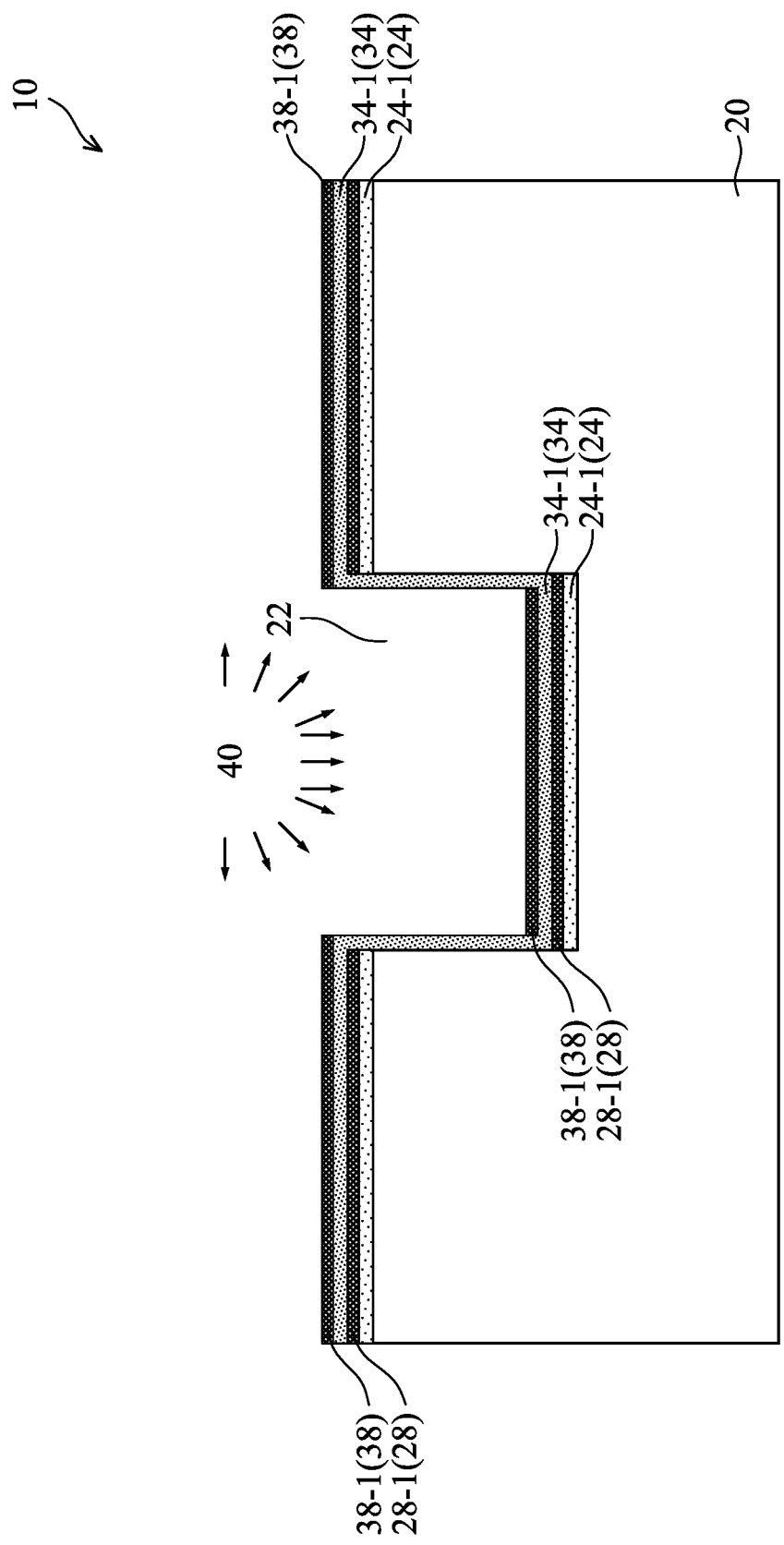

FIG. 9 illustrates an etching process 40, which may be an isotropic etching process. The respective process is illustrated as process 216 in the process flow 200 shown in FIG. 34. The etching process is performed using an etching gas that etches semiconductor layer 34-1, and does not etch passivation layer 38-1. The etching gas may include $Cl_2$, HBr, $CF_4$, $CHF_3$, $CH_2F_2$, $CH_3F$, $C_4F_6$, or combinations thereof. Dilute gases such as Ar, He, Ne, or the like, may also be added into the process gas. In the etching process 40, plasma may be turned on.

In accordance with some embodiments of the present disclosure, the etching process 40 is performed with a source power in a range between about 10 watts and about 4,000 watts. There may not be bias power applied (bias power equals 0 watts), or the bias power is very low, for example, lower than about 0.5 watts. The pressure of the etching gas may be in the range between about 1 mTorr and about 800 mTorr. The flow rate of the etching gas may be in the range between about 1 sccm and about 5,000 sccm.

Figure 10:
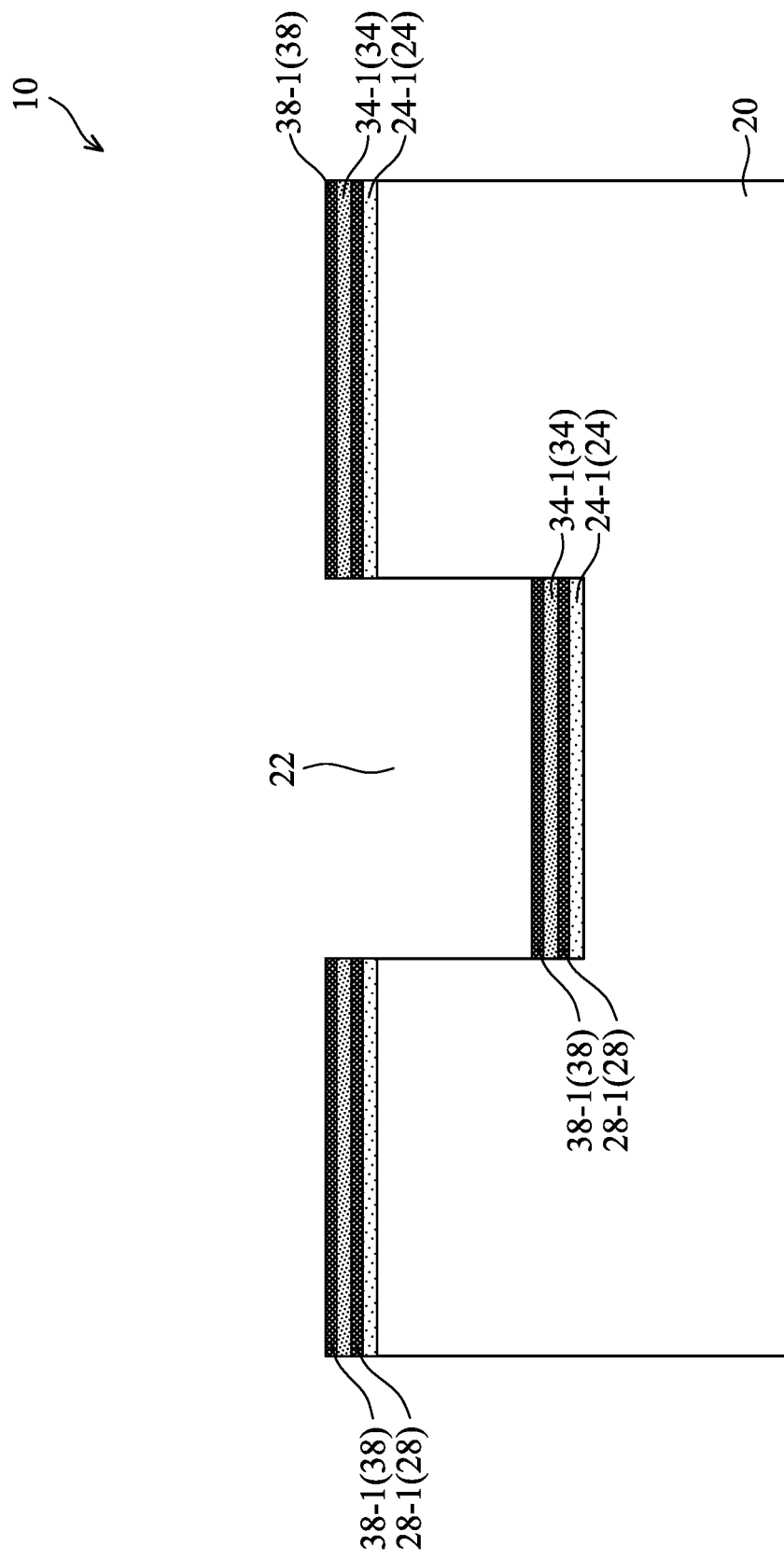

In the etching process 40, the etching selectivity, which is the ratio of the etching rate of semiconductor layer 34-1 to the etching rate of passivation layer 38-1, is high, for example, higher than about 5, and may be in the range between about 3 and about 50. The horizontal portions of semiconductor layer 34-1 are protected by passivation layer 38-1, and are not etched. On the other hand, the vertical portions of semiconductor layer 34-1 are etched. The resulting structure is shown in FIG. 10, in which the sidewalls of substrate 20 are exposed again. It is appreciated that passivation layer 38-1 may extend to the sidewalls of substrate 20, or may be spaced apart from the sidewalls of substrate 20. Semiconductor layer 34-1 extends to the sidewalls of substrate 20, while there are no vertical portions or substantially no vertical portions of semiconductor layer 34-1 remaining.

In accordance with some embodiments of the present disclosure, in the etching process 40, a byproduct may be generated, which may include $SiO_xCl_y$, in accordance with some embodiments. The byproduct may be removed using a chemical solution including $H_2SO_4$, $HNO_3$, $NH_3$, HF, HCl, or combinations thereof. Gases such as $O_3$, $H_2$, or the like may be added into the chemical solution. The respective process is illustrated as process 218 in the process flow 200 shown in FIG. 34. The solvent of the chemical solution may include water, alcohol, or the like.

Figure 11:
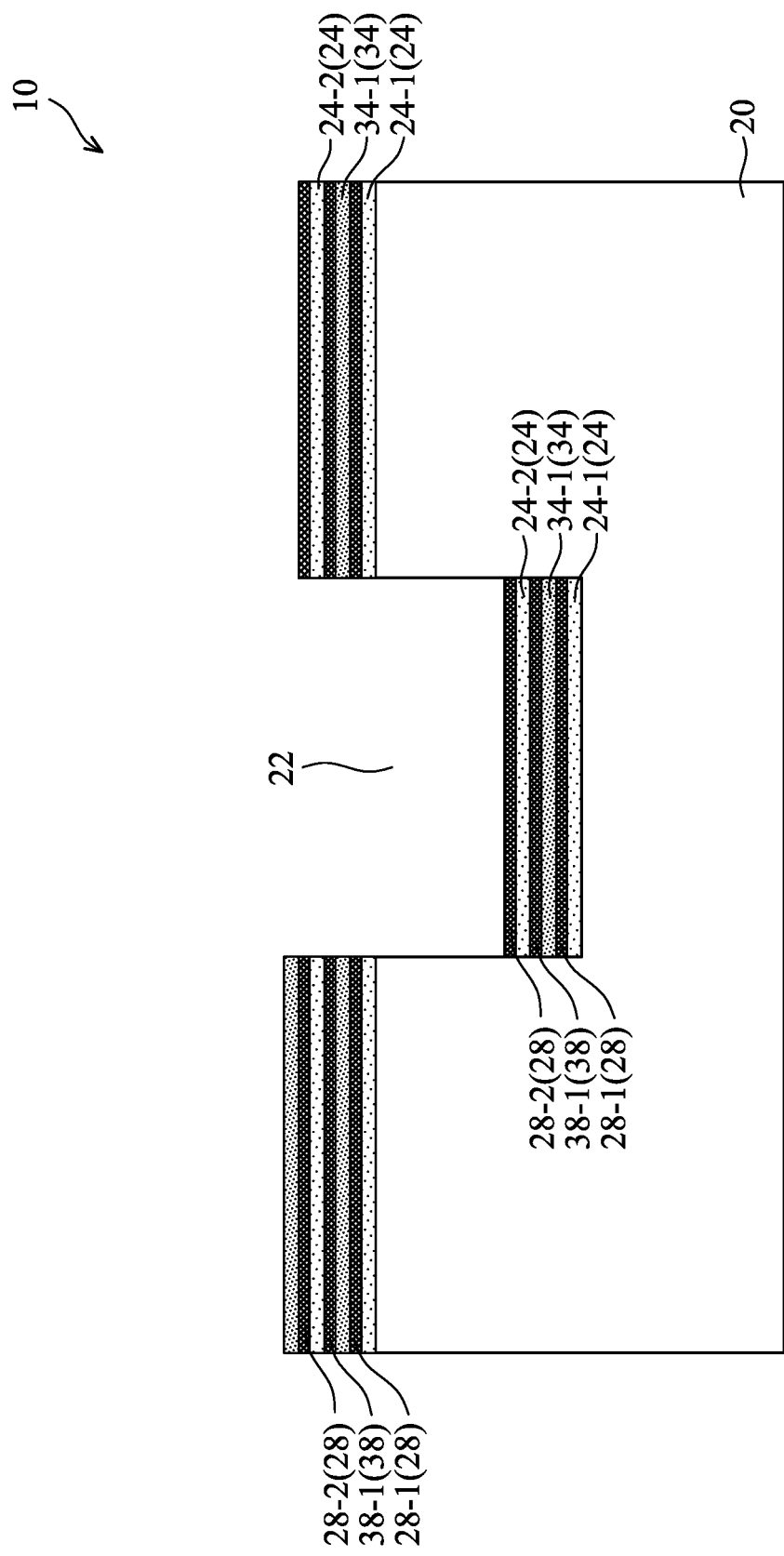
Figure 12:
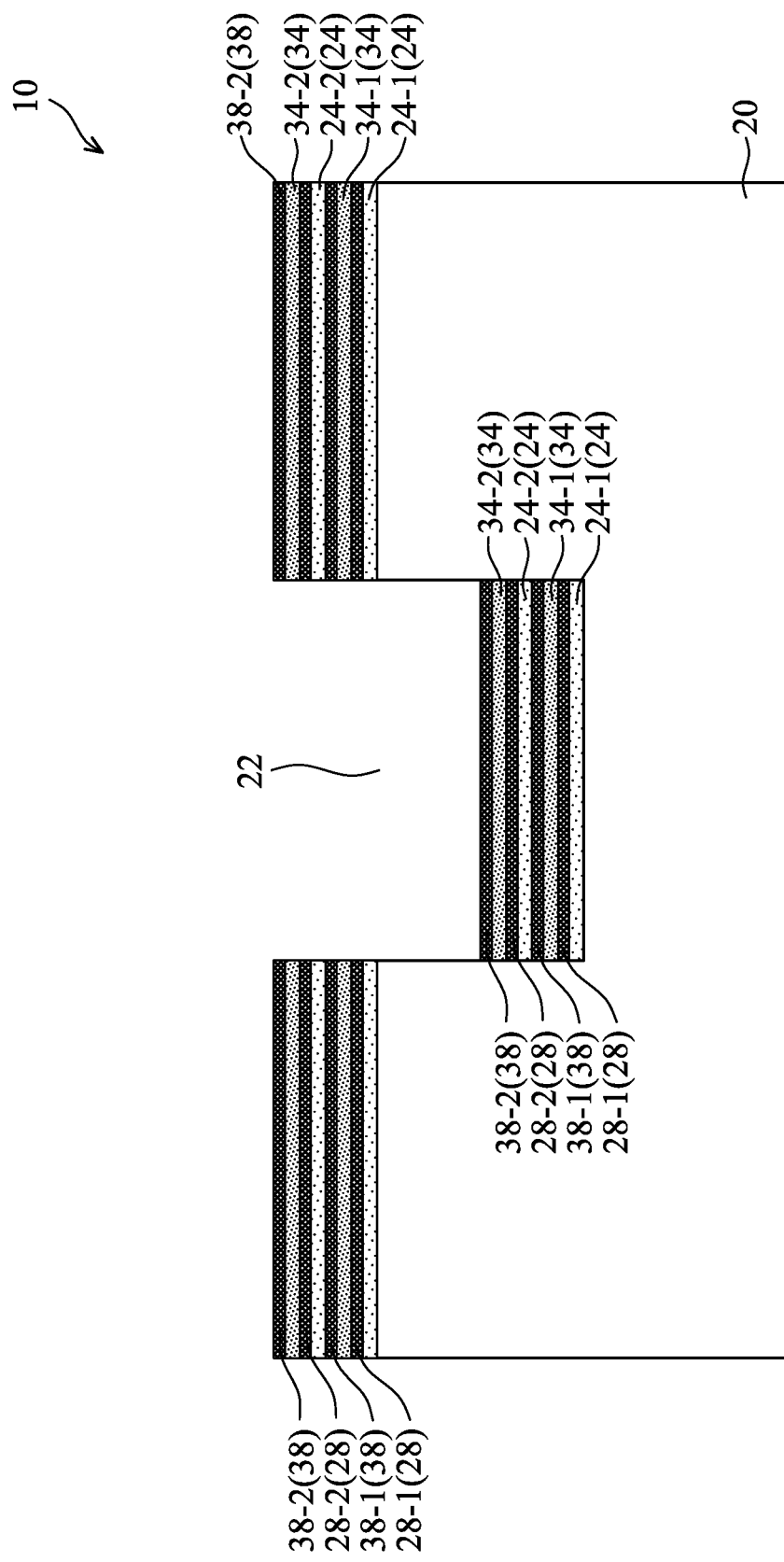
Figure 13:
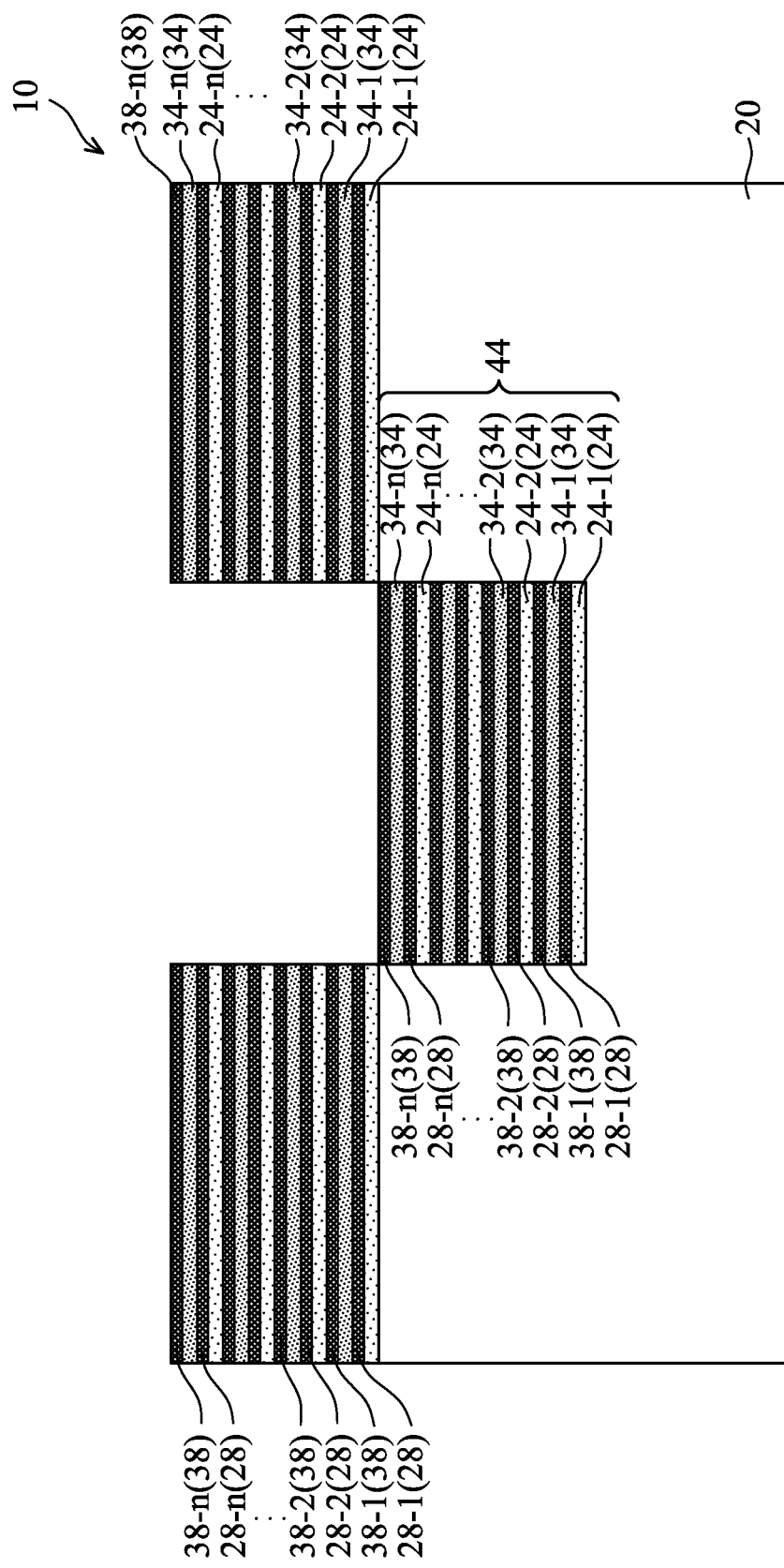

FIGS. 11 and 12 illustrate the formation of more stacked layers. The respective process is illustrated as process 220 in the process flow 200 shown in FIG. 34. FIG. 11 illustrates the formation of semiconductor layer 24-2 and passivation layer 28-2. The material and the formation processes are similar to the material and the formation processes of semiconductor layer 24-1 and passivation layer 28-1, respectively, and are not repeated herein. FIG. 12 illustrates the formation of semiconductor layer 34-2 and passivation layer 38-2. The material and the formation processes are similar to the material and the formation processes of semiconductor layer 34-1 and passivation layer 38-1, respectively, and are not repeated herein. There may be, or may not be, more layers such as 24-n, 28-n, 34-n, and 38-n formed, wherein n may be 3, 4, 5, or more, for example, up to 10. The resulting structure is shown in FIG. 13, and the resulting stacked layers are referred to as stacked layers 44. In accordance with alternative embodiments of the present disclosure, after the process as shown in FIG. 12, no more layers similar to layers 24-1, 28-1, 34-1, and 38-1 are formed. The top layer of stacked layers 44 may be a passivation layer 38 of a channel 34 or may be the passivation layer 28 of a semiconductor layer 24. Stacked layer 44 may fully fill trench 22, or may leave a top portion of trench 22 unfilled.

Figure 14:
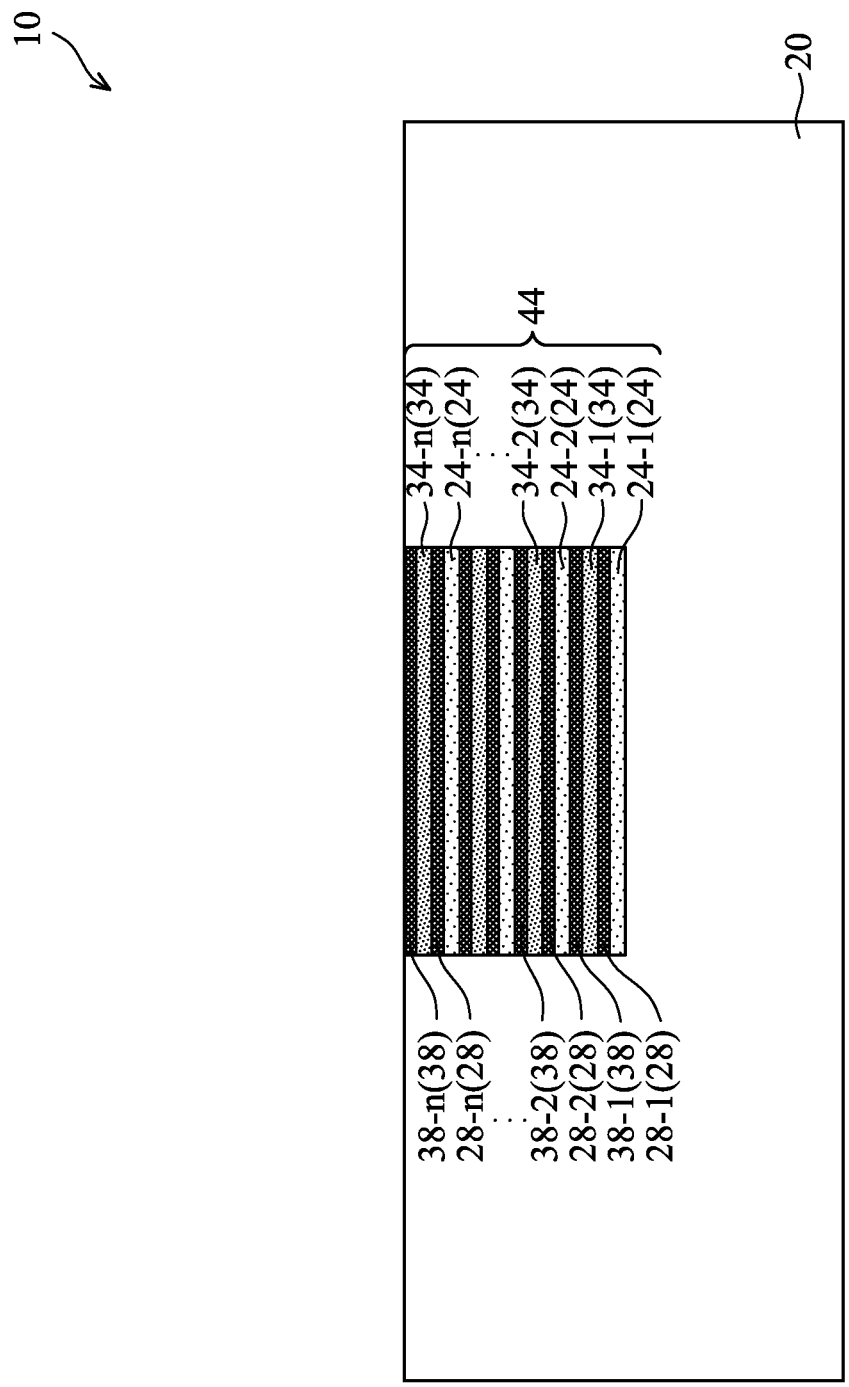

FIG. 14 illustrates a planarization process, so that excess materials outside of trench 22 are removed. The respective process is illustrated as process 222 in the process flow 200 shown in FIG. 34. The planarization may use one of semiconductor layers 24-1, 28-1, 34-1, and 38-1 as a CMP stop layer.

In subsequent processes, transistors are formed. In accordance with some embodiments, the formed transistors include a GAA transistor neighboring two FinFET s as an example. The formation processes of the transistors are shown in FIGS. 15 through 17, 18A, 18B-1 and 18B-2.

Figure 15:
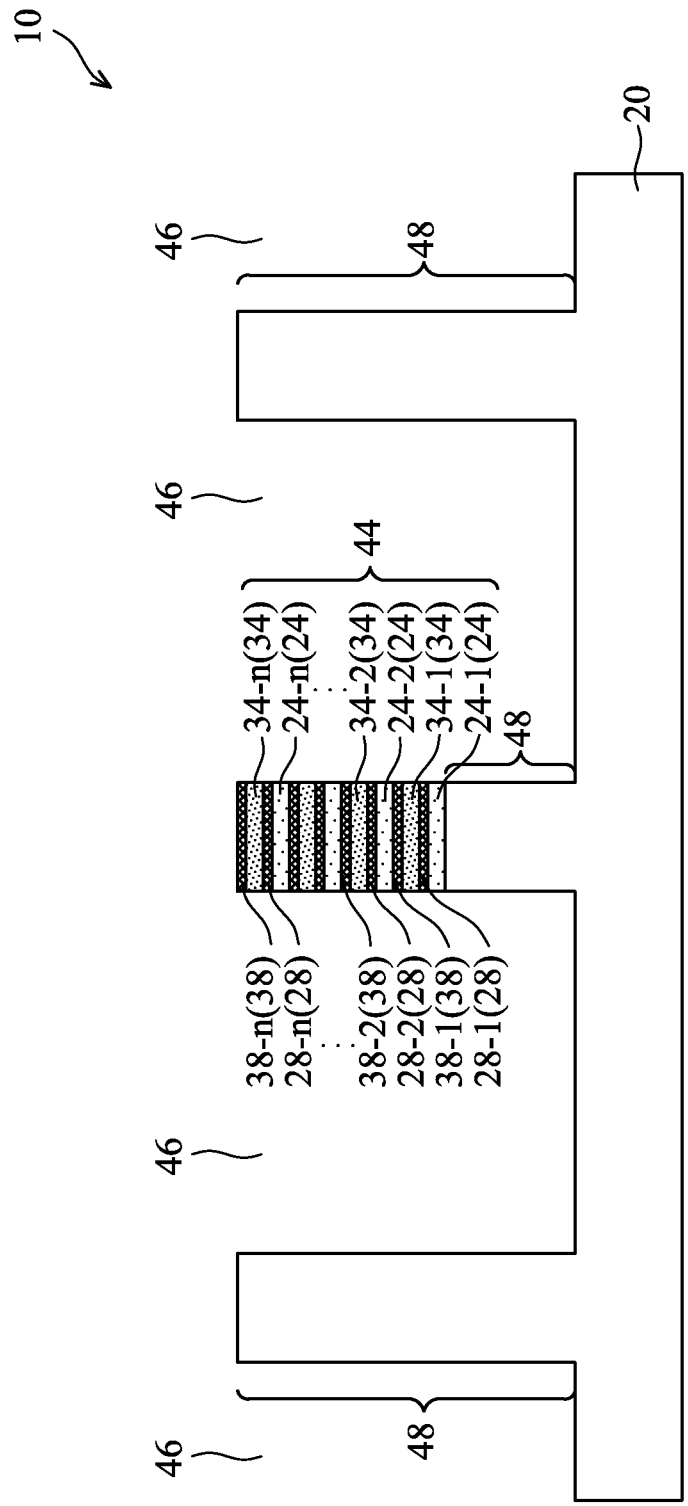
Figure 16:
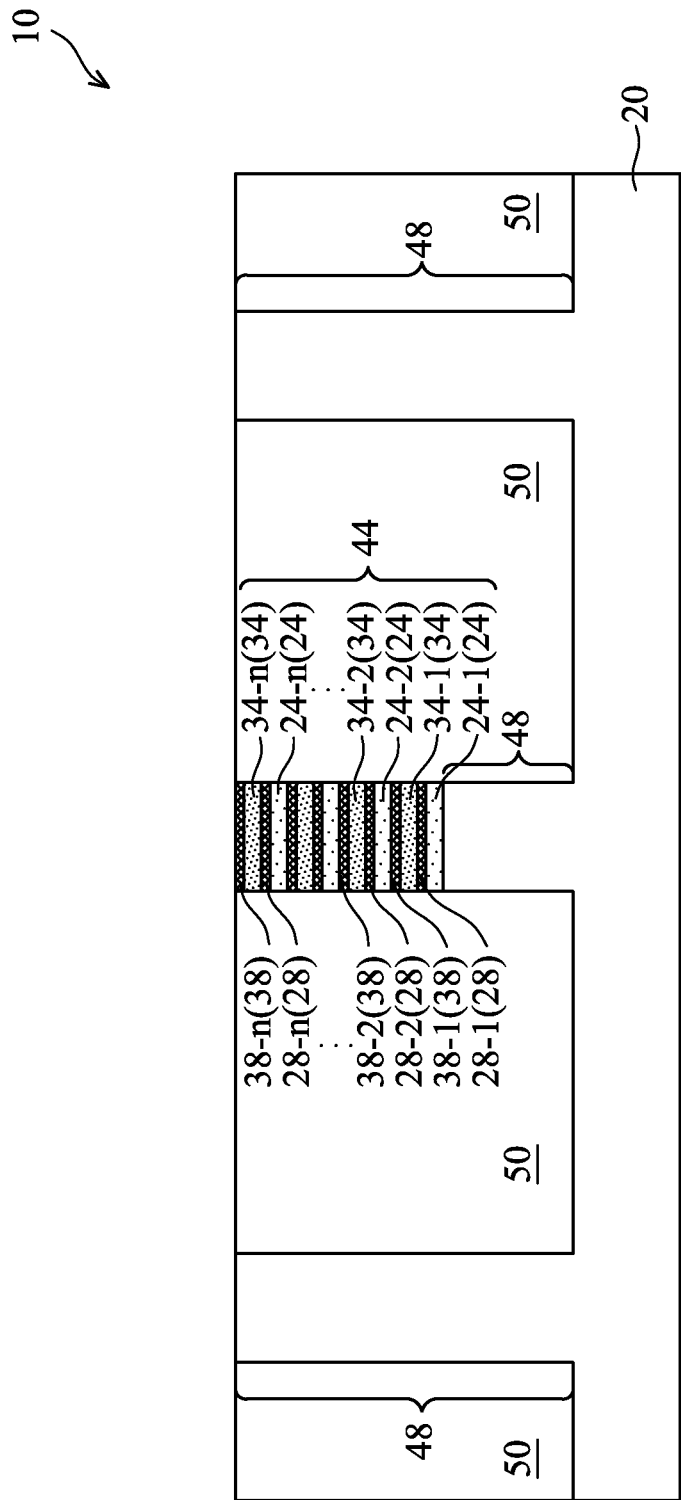

Referring to FIG. 15, the stacked layers 44 and substrate 20 are etched, forming trenches 46. The respective process is illustrated as process 224 in the process flow 200 shown in FIG. 34. The patterned substrate 20 and stacked layers 44 form semiconductor strips 48 and the patterned stacked layers 44, respectively. Next, referring to FIG. 16, isolation regions 50 are formed to fill trenches 46. Isolation regions 50 are alternatively referred to as Shallow Trench Isolation (STI) regions hereinafter. The respective process is illustrated as process 226 in the process flow 200 shown in FIG. 34. STI regions 50 may include a liner dielectric (not shown), which may be a thermal oxide layer formed through the thermal oxidation of a surface layer of substrate 20, and a dielectric material over the liner dielectric, wherein the dielectric material may be formed using Flowable Chemical Vapor Deposition (FCVD), spin-on coating, or the like. The dielectric material over the liner dielectric may include silicon oxide, silicon nitride, or the like in accordance with some embodiments.

Figure 17:
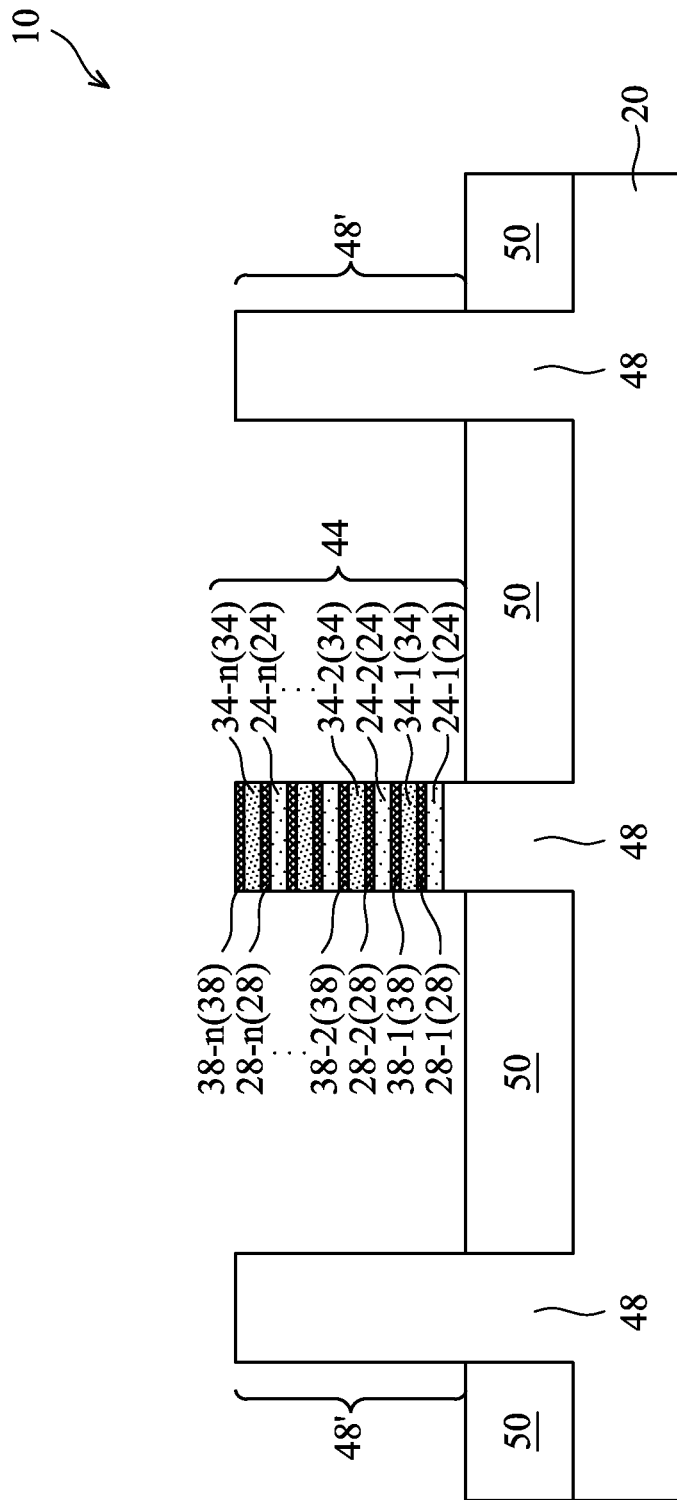

Referring to FIG. 17, STI regions 50 are recessed, so that the top portions of semiconductor strips 48 protrude higher than the top surfaces of the remaining portions of STI regions 50 to form protruding fins 48'. The respective process is illustrated as process 228 in the process flow 200 shown in FIG. 34. The etching may be performed using a dry etching process, wherein $NF_3$ and $NH_3$, for example, are used as the etching gases. During the etching process, plasma may be generated. Argon may also be included. In accordance with alternative embodiments of the present disclosure, the recessing of STI regions 50 is performed using a wet etching process. The etching chemical may include HF, for example. The sidewalls of the stacked layers 44 are thus exposed.

Figures 2, 18B:
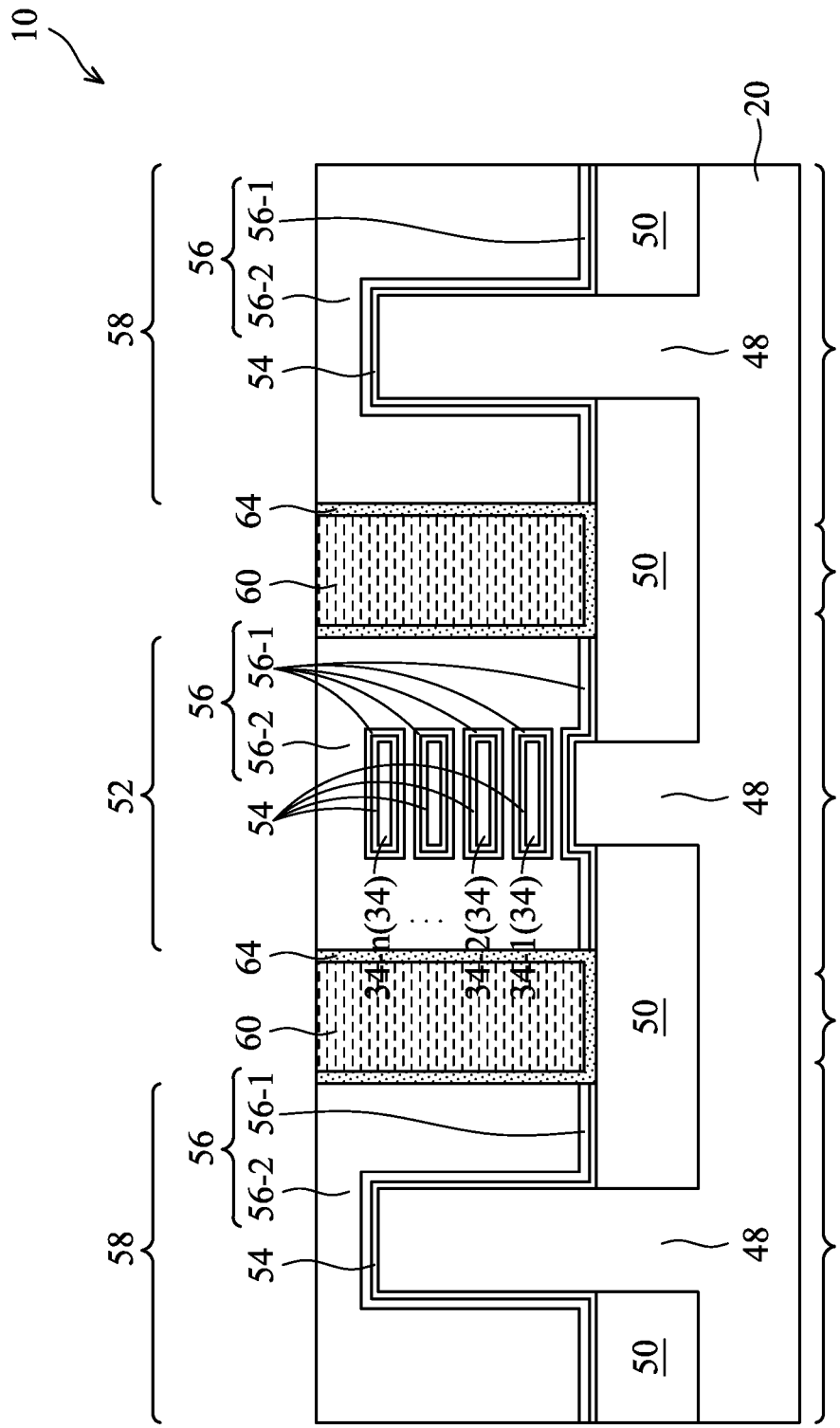

FIGS. 18A, 18B-1, and 18B-2 illustrate the cross-sectional view in the formation of GAA transistor 52 and FinFETs 58. The respective process is illustrated as process 230 in the process flow 200 shown in FIG. 34. It is appreciated that the cross-sectional view is obtained from the channels and the gate stacks of GAA transistor 52 and FinFETs 58. The source/drain regions of the transistors are in different cross-sections, and are not shown. GAA transistor 52 includes channels 34 (including 34-1 through 34-n), gate dielectrics 54 encircling channels 34, and gate electrode 56. The formation process of GAA transistors 52 and FinFETs 58 may include forming dummy gate stacks and gate spacers on the protruding structures shown in FIG. 17, forming source/drain regions (not shown), and then forming Contact Etch Stop Layer (CESL) 64 and Inter-Layer Dielectric (ILD) 66. One or a plurality of etching processes are then performed to remove the dummy gate stacks, sacrificial semiconductor layers 24, passivation layers 28 (including 28-1 through 28-n), and passivation layers 38 (including 38-1 through 38-n). Channel semiconductor layers 34-1 through 34-n are left unremoved. Gate dielectrics 54 and a replacement gate electrode 56 (which may be metal gate electrode) are then formed. FinFETs 58 are also formed. It is appreciated that although the illustrated example embodiment show that GAA transistors 52 and FinFETs 58 share a same replacement gate electrode 56, as shown in FIG. 18A, in other embodiments, they may not share the replacement gate electrode 56, as is shown in FIGS. 18B-1 and 18B-2. FIG. 18B-1 illustrates that the cutting between the gate stacks of the GAA transistors 52 and FinFETs 58 is performed before the formation of the replacement gates. Accordingly, gate dielectrics 54 and gate electrodes 56 (including, for example, work function layer 56-1 and other metal layers 56-2) have sidewall portions. In accordance with these embodiments, the cuts may be performed on the dummy gate electrodes (not shown). FIG. 18-1 illustrates the cutting between the gate stacks of the GAA transistors 52 and FinFETs 58 is performed directly on the replacement gates. Accordingly, gate dielectrics 54 and gate electrodes 56 (including, for example, work function layer 56-1 and other metal layers 56-2) do not have sidewall portions.

In accordance with some embodiments, FinFETs 58 and GAA transistor 52 are closely located. The sizes of the interface area between GAA transistor 52 and its neighboring FinFETs 58 are affected by the stacked layers 44. For example, if stacked layers 44 are formed as being conformal layers extending into trench 22 (FIG. 2), each of the stacked layers 44 will have sidewall portions, and all of the sidewall portions will occupy chip area. This would significantly increase the interface area between GAA transistors and neighboring transistors. By selectively removing the sidewall portions of the stacked layers from the trench the interface area is reduced. The interface region between GAA transistor 52 and its neighboring FinFETs 58 is reduced, and the density of devices may be reduced.

FIGS. 19 through 27 illustrate the cross-sectional views of intermediate stages in the formation of stacked layers 44' in accordance with some embodiments of the present disclosure. These embodiments are similar to the embodiments shown in FIGS. 1 through 17, 18A, 18B-1, and 18B-2, except that instead of forming passivation layers prior to etching in order to protect the horizontal portions of the stacked layers, the etching is started without the passivation layer, and the byproduct of the etching are used. Accordingly, the two-step etching processes for remove the vertical portions of the stacked layers are replaced with one-step etching processes. Unless specified otherwise, the materials and the formation processes of the components in these embodiments are essentially the same as the like components, which are denoted by like reference numerals in the preceding embodiments shown in FIGS. 1 through 18. The details regarding the formation processes and the materials of the components shown in FIGS. 19 through 27 may thus be found in the discussion of the preceding embodiments.

Figure 19:
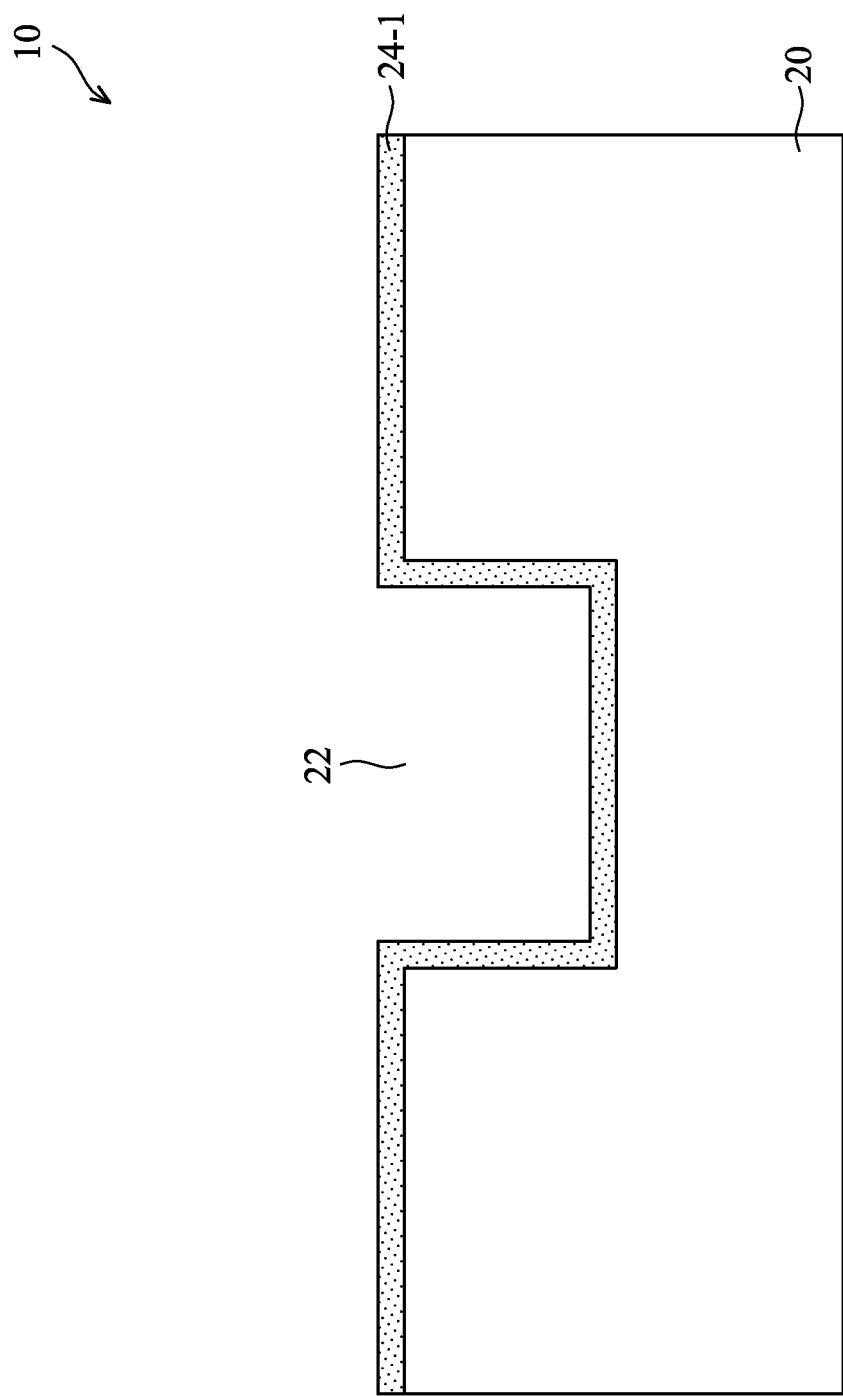
FIGS. 19 through 27 illustrate the cross-sectional views of intermediate stages in the formation of stacked layers in accordance with some embodiments.
Figure 20:
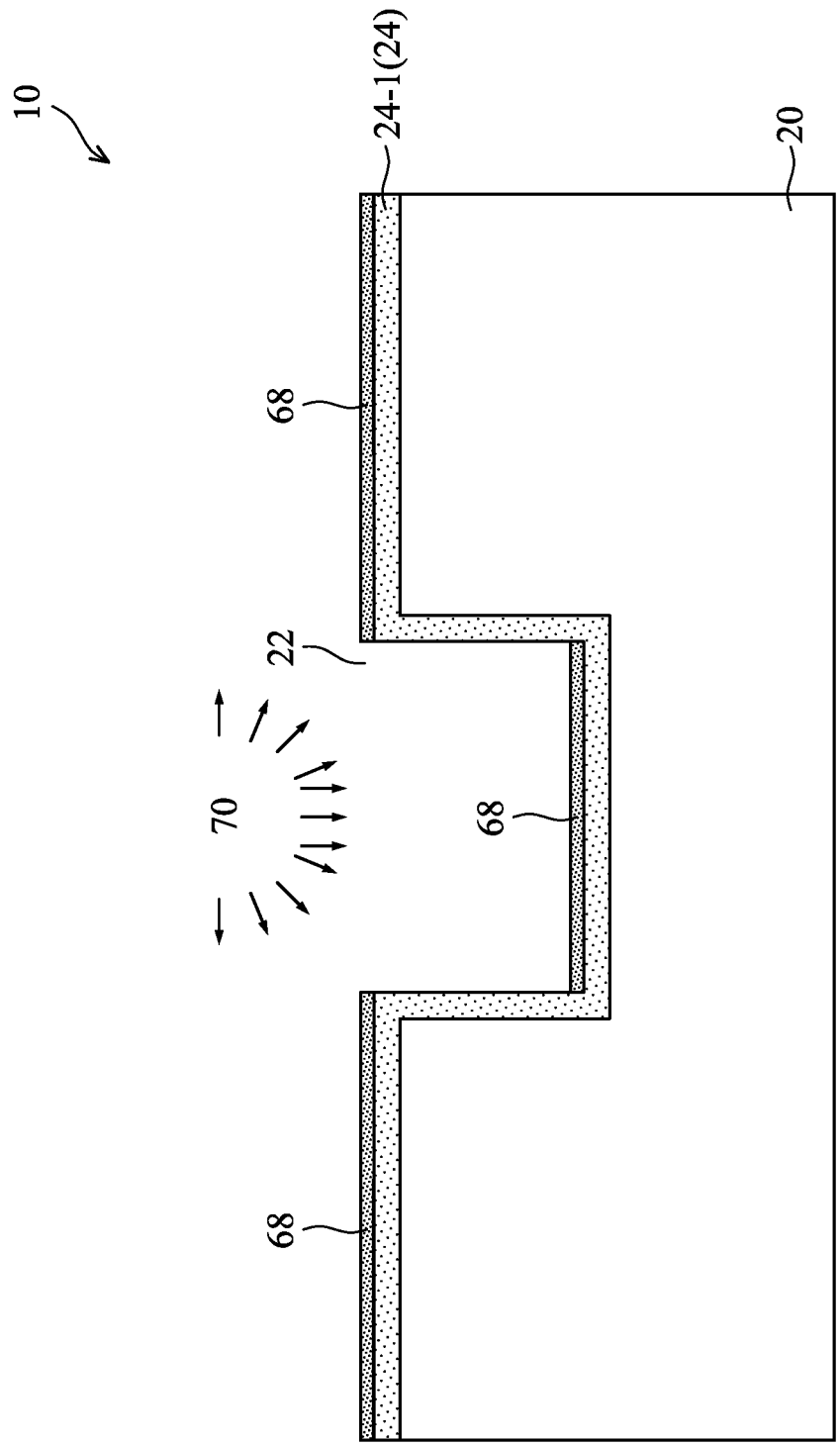

The initial processes of these embodiments are essentially the same as shown in FIGS. 1 through 3, and the resulting structure is shown in FIG. 19, in which semiconductor layer 24-1 is formed. Next, as shown in FIG. 20, an isotropic etching process 70 is performed. The process gas includes both of an etching gas(es) and a passivation gas(es). The etching gas may include $Cl_2$, HBr, $CF_4$, $CHF_3$, $CH_2F_2$, $CH_3F$, $C_4F_6$, or combinations thereof. The passivation gas may also include nitrogen ($N_2$), oxygen ($O_2$), $SO_2$, $CH_4$, $CO_2$, CO, $SiCl_4$, or combinations thereof. Other gases such as Ar, He, Ne, or the like, may also be added into the process gas. In accordance with some embodiments of the present disclosure, the etching process is performed with a source power in a range between about 10 watts and about 4,000 watts. There may not be bias power applied (with the bias power being equal 0 watts), or the bias power is very low, for example, lower than about 0.5 watts. The pressure of the process gas may be in the range between about 1 mTorr and about 800 mTorr. The flow rate of the process gas may be in the range between about 1 sccm and about 5,000 sccm.

Referring to FIG. 20, in the etching process 70, byproduct layer 68 is formed, and is deposited on the horizontal surfaces of semiconductor layer 24-1. On the vertical portions of semiconductor layer 24-1, the byproduct layer 68 has less chance to stay due to the conductance effect, and will be pumped out of the respective etching chamber. The byproduct layer 68 may include SiOBrCl, for example. The byproduct layer 68 protects the horizontal portions of semiconductor layer 24-1, and hence the vertical portions of semiconductor layer 24-1 can be removed, resulting in the structure shown in FIG. 21. Process gases and etching conditions may be adjusted to increase the generation of the byproduct layer 68 in order to provide adequate protection of the horizontal portions of semiconductor layer 24-1. For example, the flow rate of the oxygen-containing gas(es) in the passivation gas may be increased, for example, to about 1 sccm and about 1000 sccm, so that byproduct layer 68 is generated faster.

Figure 21:
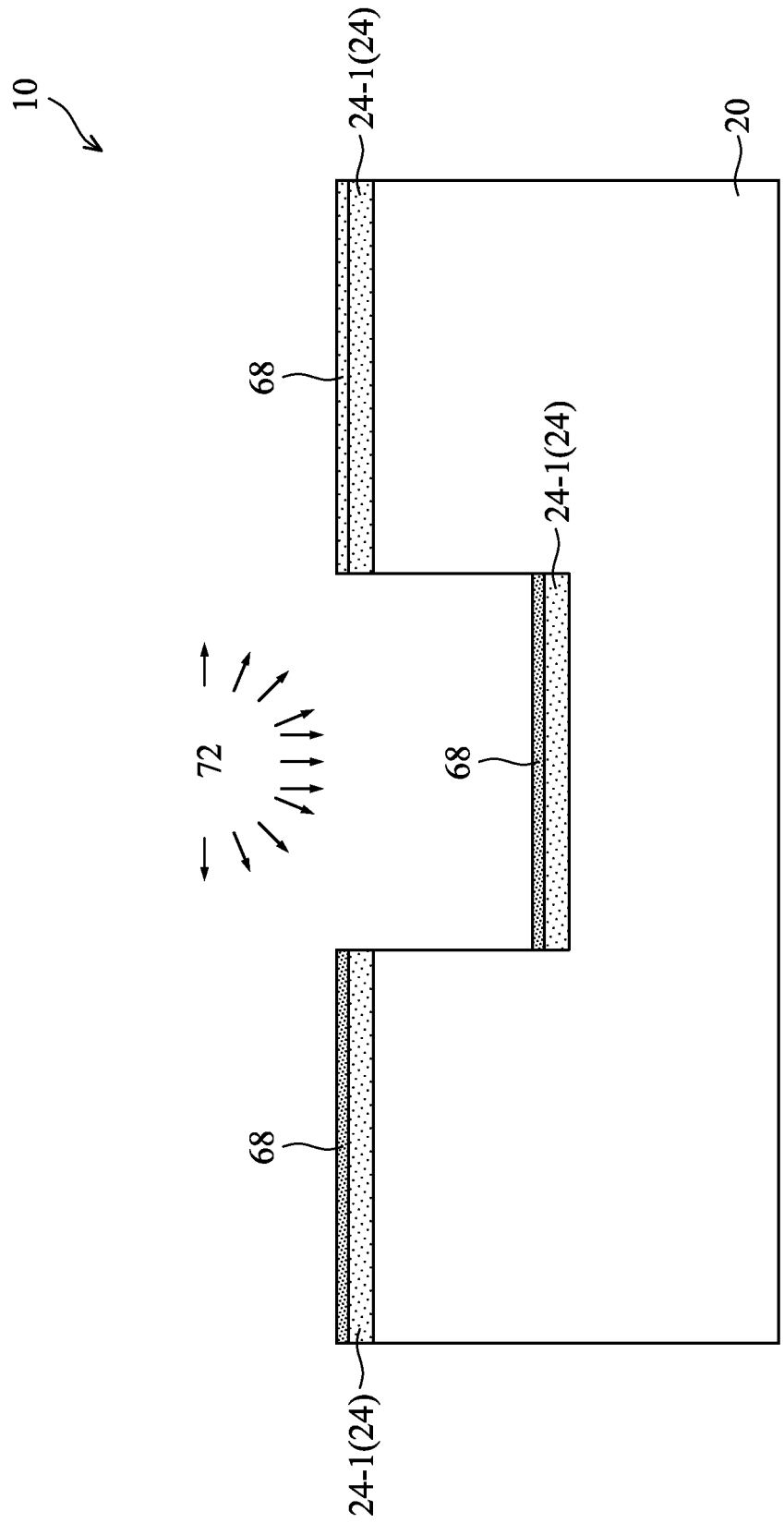
Figure 22:
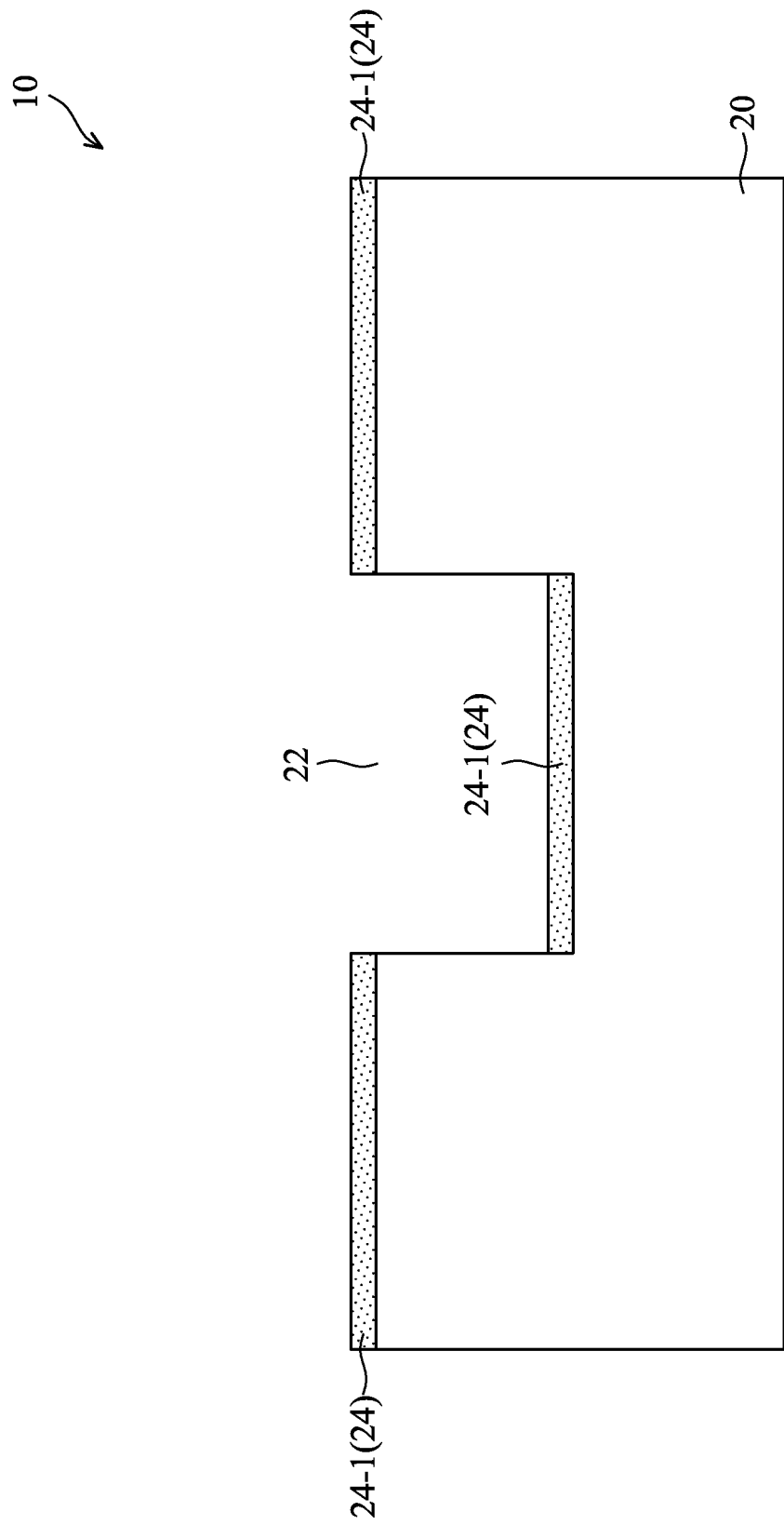

Referring to FIG. 21, after the vertical portions of the semiconductor layer 24-1 are removed, the byproduct layer 68 may be removed in an isotropic etching process 72. The etchant may include $H_2SO_4$, $HNO_3$, $NH_3$, HF, HCl, or combinations thereof. Gases such as $O_3$, $H_2$, or the like may be added into the chemical solution. The solvent of the chemical solution may include water, alcohol, or the like. The resulting structure is shown in FIG. 22.

Figure 23:
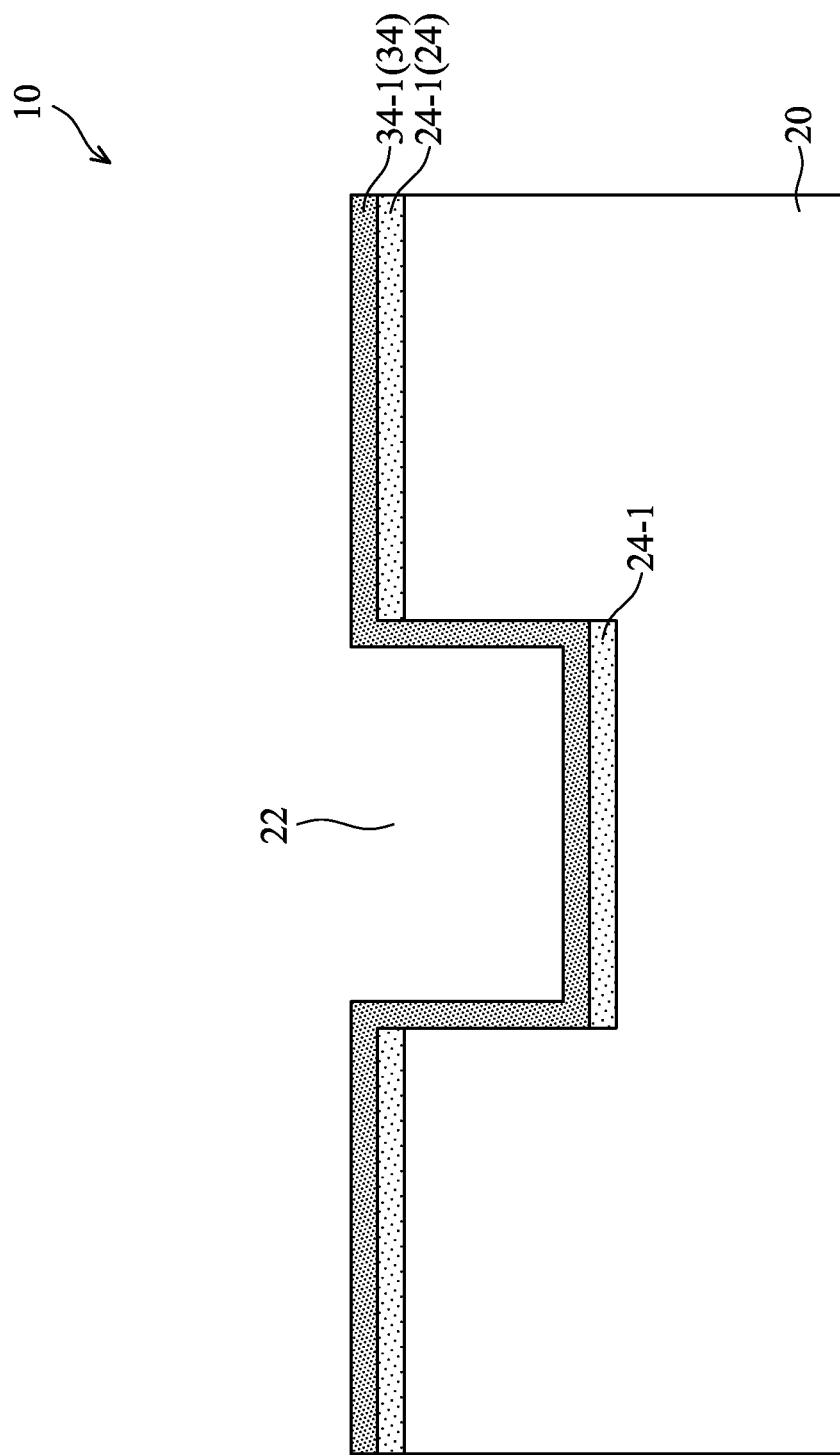
Figure 24:
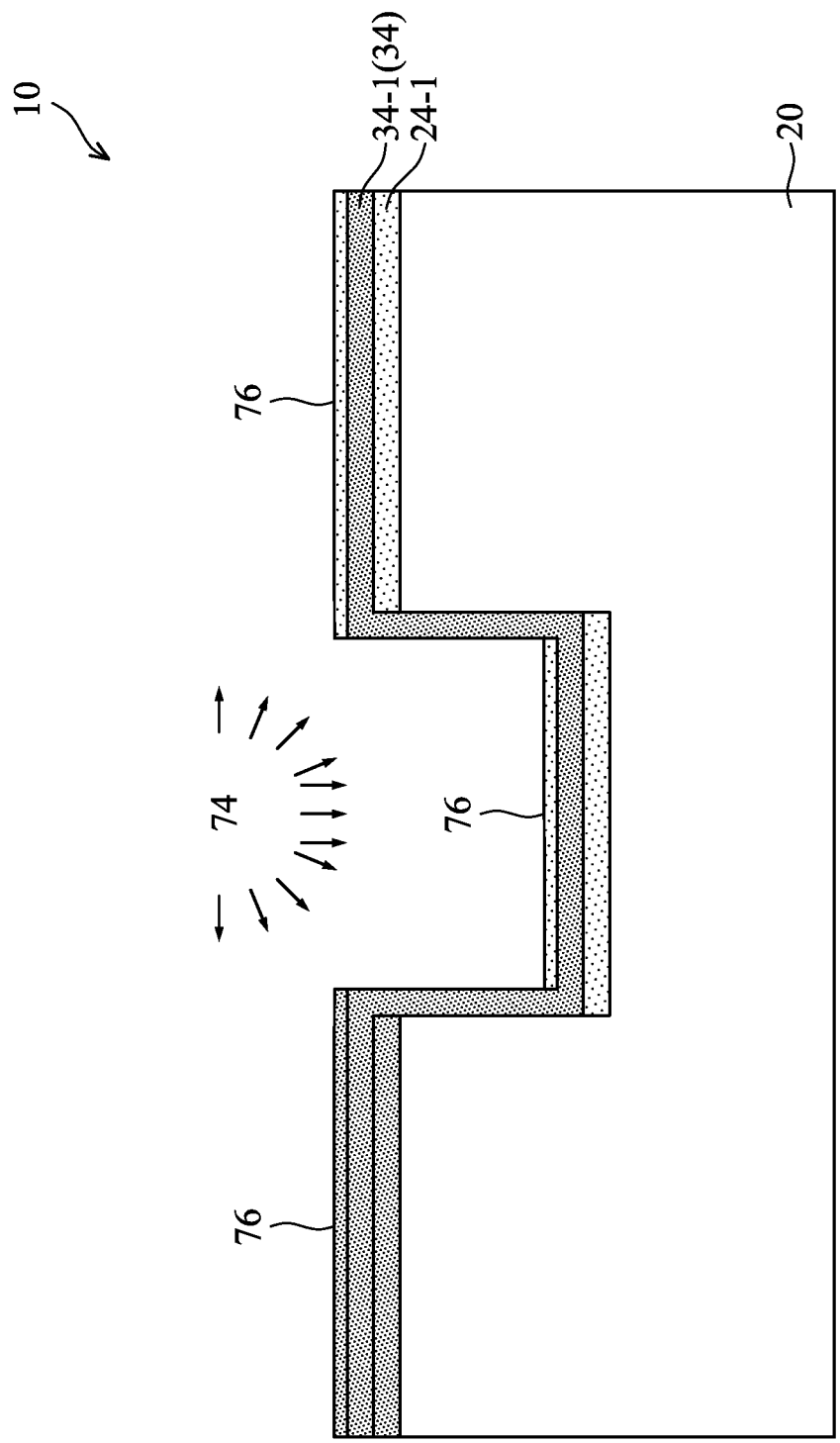
Figure 25:
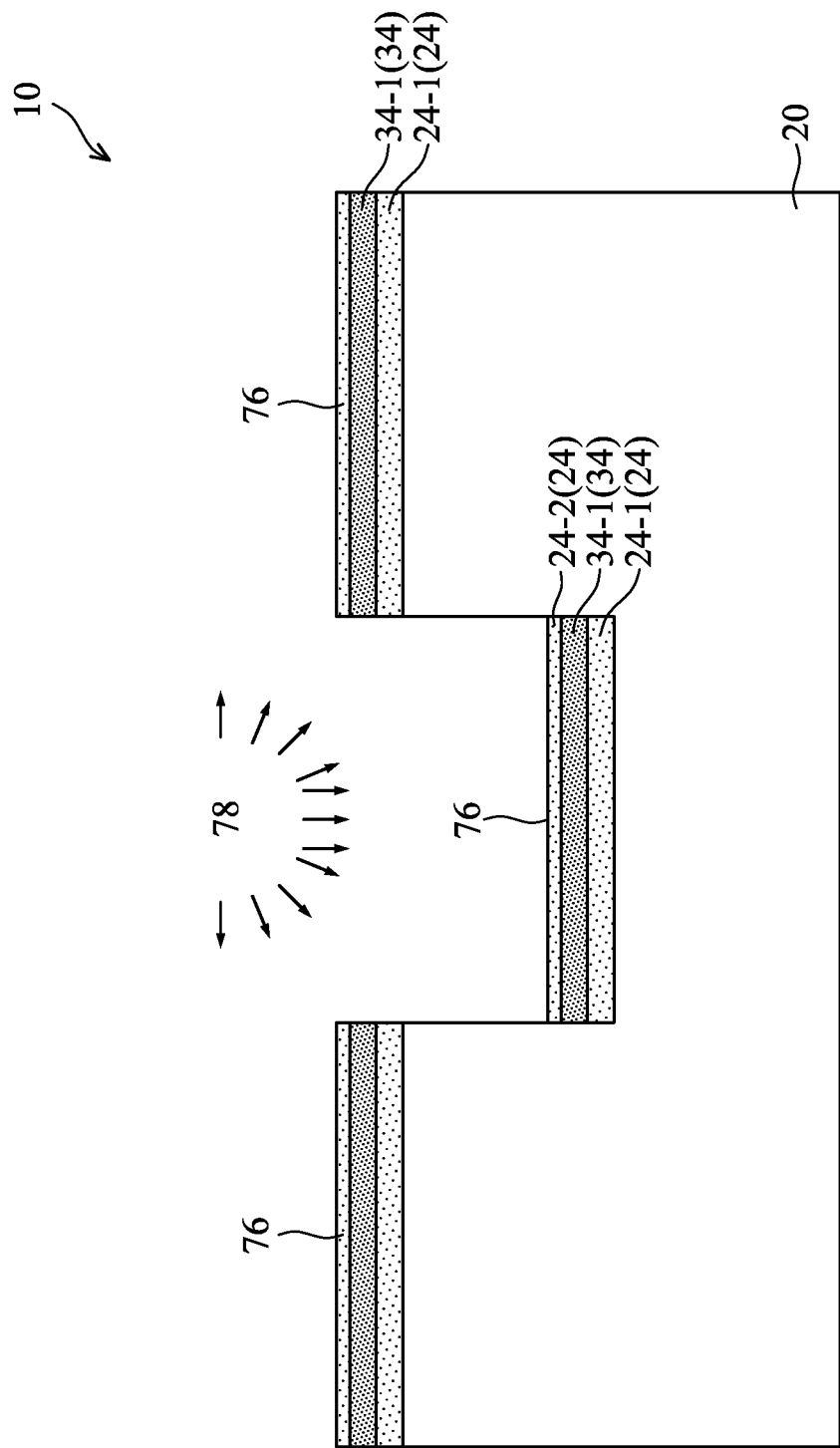
Figure 26:
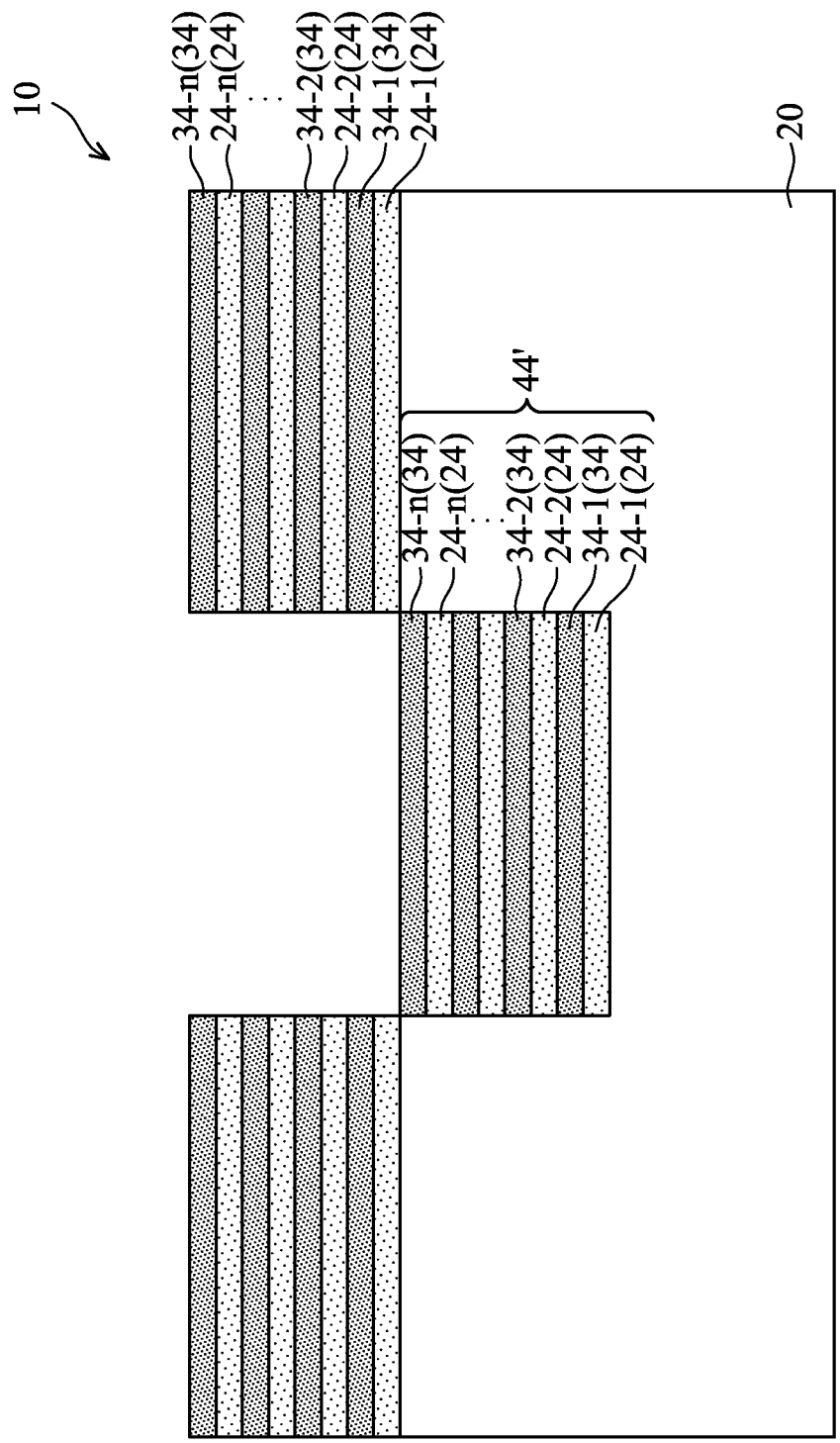

FIG. 23 illustrates the deposition of semiconductor layer 34-1, which may be a conformal layer. Next, as shown in FIG. 24, an isotropic etching process 74 is performed to etch the vertical portions of semiconductor layer 34-1, while the horizontal portions of the semiconductor layer 34-1 are etched less and will have majority remaining. The etching process may be performed using a process gas comprising both of an etching gas(es) and a passivation gas, wherein the example gases and process conditions may be similar to the process 70 shown in FIG. 20. Byproduct layer 76 is thus formed on the horizontal portions of semiconductor layer 34-1 so that the vertical portions of semiconductor layer 34-1 are selectively removed. FIG. 25 illustrates the etching process 78 for removing byproduct layer 76.

In subsequent processes, more semiconductor layers 24 (including 24-2 through 24-n) and semiconductor layers 34 (including 34-2 through 34-n) may be formed using the similar processes as shown in FIGS. 19 through 25. Stacked layers 44', which include semiconductor layers 34 and semiconductor layer 24, are thus formed. A planarization process is then performed, resulting in the structure shown in FIG. 27. The subsequent processes are similar to the processes shown in FIGS. 15 through 17, 18A, 18B-1, and 18B-2, which are not repeated herein.

Figure 27:
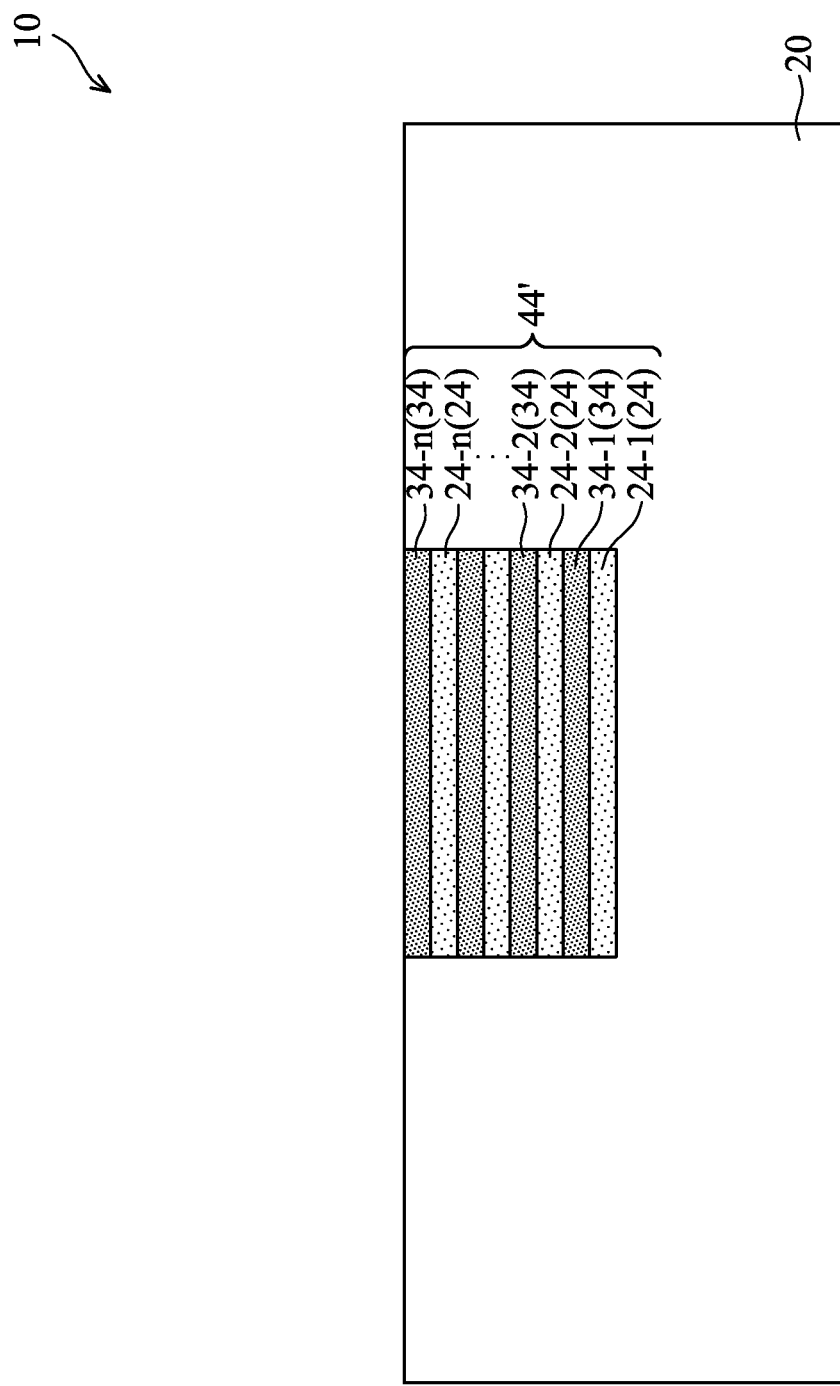
Figure 28:
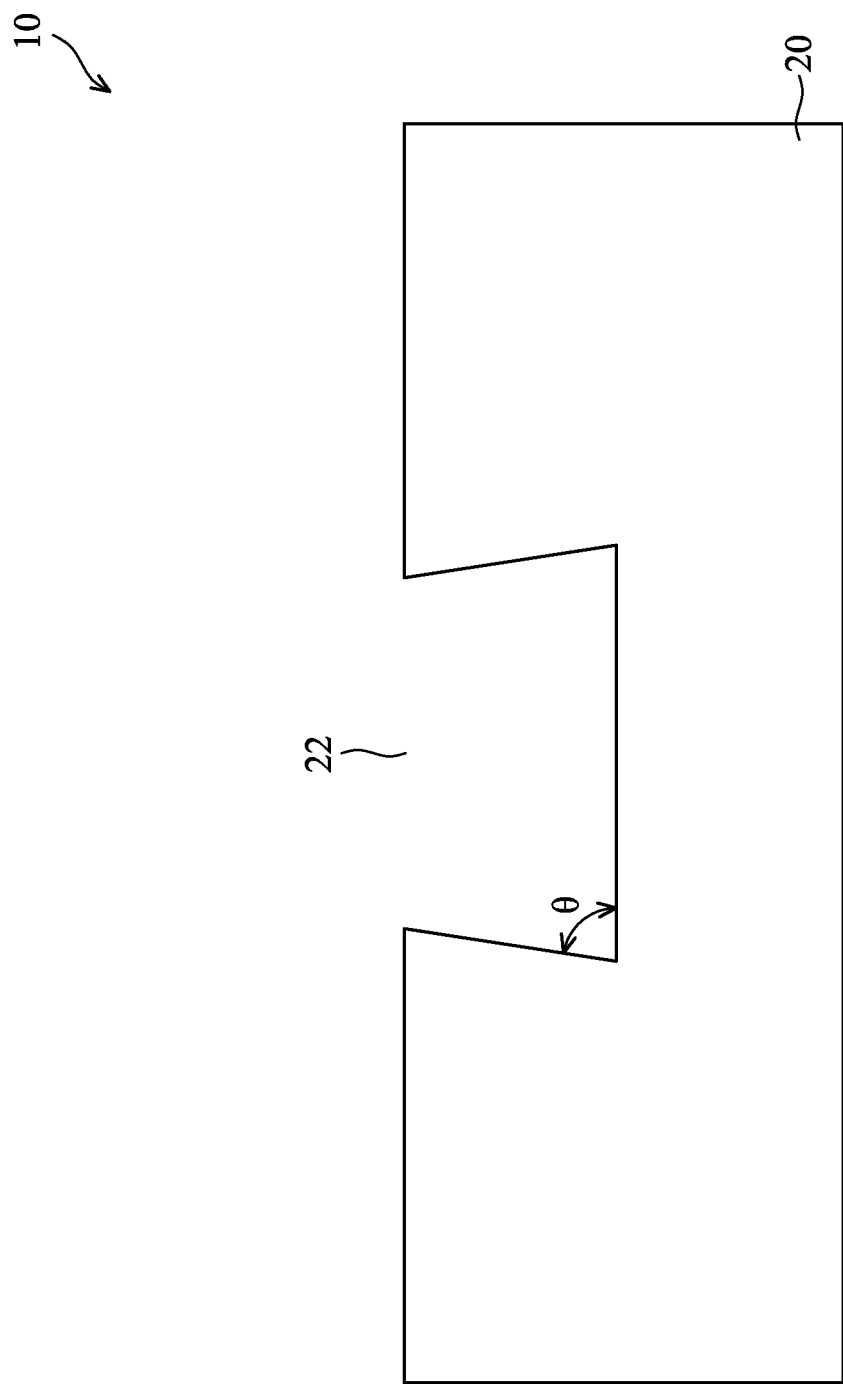
FIGS. 28 and 29 illustrate the cross-sectional views of intermediate stages in the formation of stacked layers with upper layers being increasing narrower than respective lower layers in accordance with some embodiments.
Figure 29:
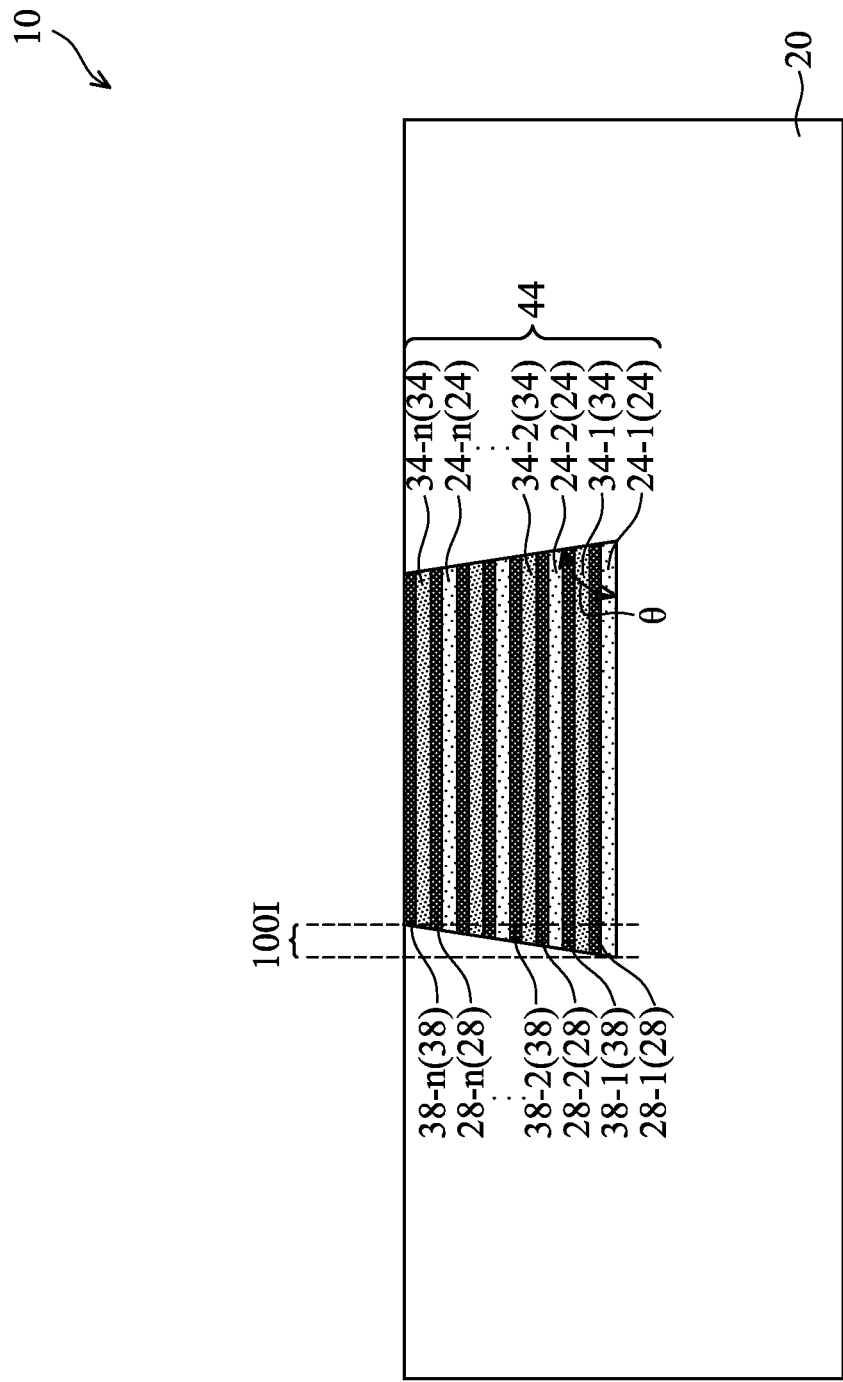

By adopting the embodiments of the present disclosure, stacked layers 44 or 44' may have different types of edge profiles other than the edge profiles shown in FIGS. 18 and 27. For example, FIGS. 28 and 29 illustrate the formation of stacked layers 44 with sharp or obtuse tilt angles θ. FIG. 28 illustrates the etching of substrate 20 to form trench 22 with sharp tilt angles θ. Next, the deposition processes as shown in FIGS. 3 through 14 are performed to form stacked layers 44, as shown in FIG. 29. In accordance with some embodiments, as aforementioned in preceding paragraphs, the tilt angle θ may also be smaller than 89°, for example, in the range between about 85° and about 89°. Tilt angle θ may also be smaller than about 85°.

Figure 30:
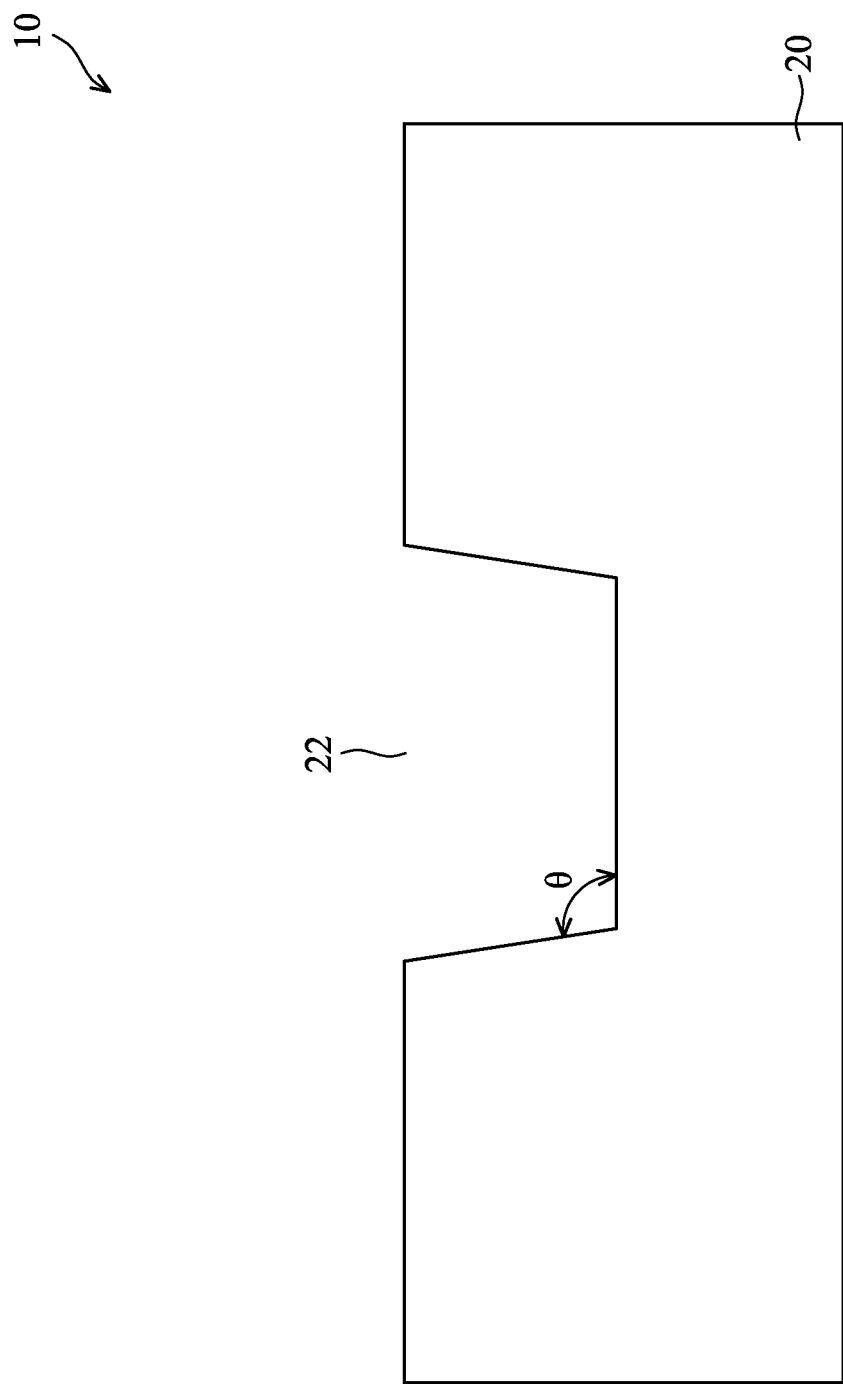
FIGS. 30 and 31 illustrate the cross-sectional views of intermediate stages in the formation of stacked layers with upper layers being increasing wider than respective lower layers in accordance with some embodiments.
Figure 31:
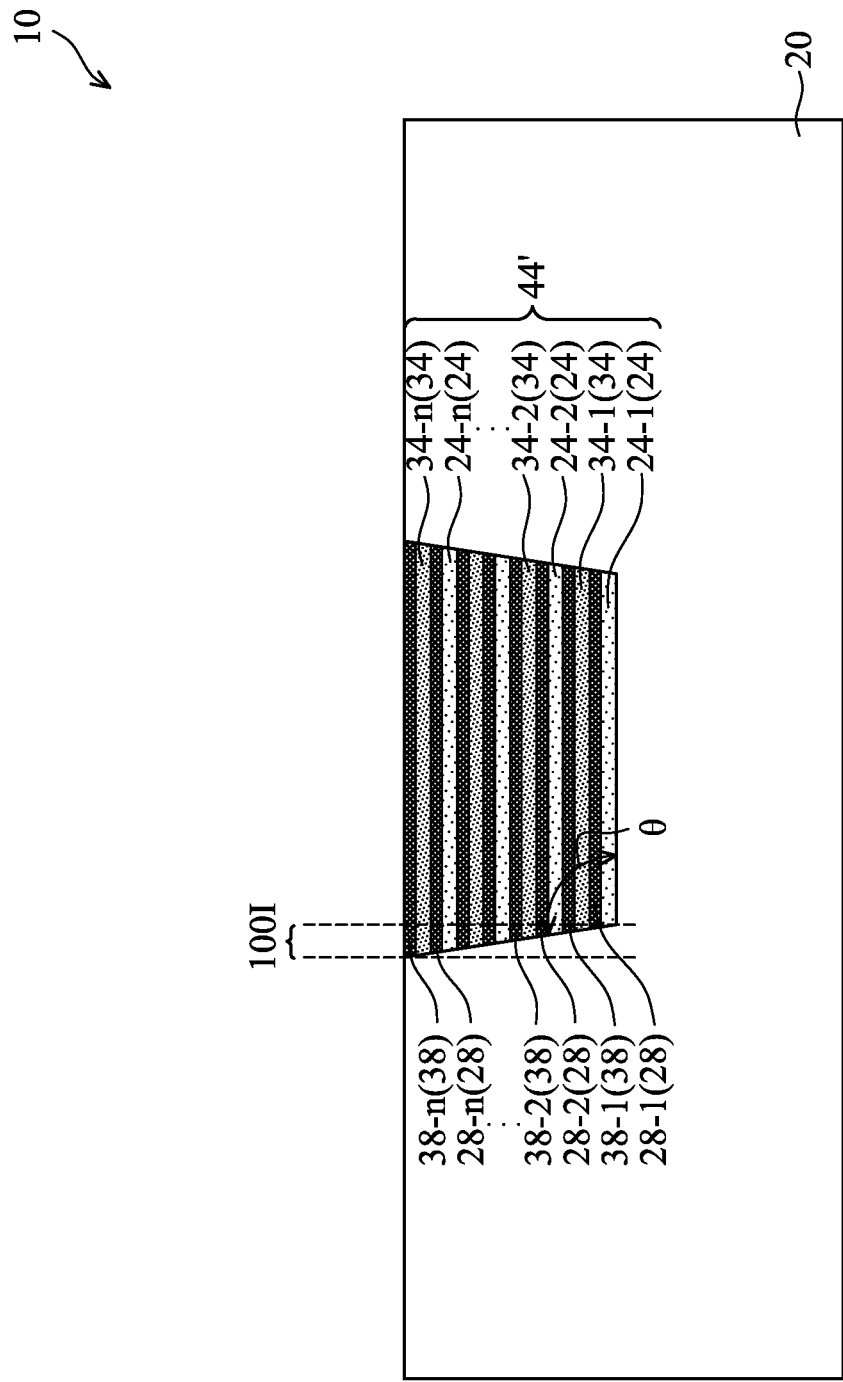

FIG. 30 illustrates the etching of substrate 20 to form trench 22 having obtuse tilt angles θ. Next, the deposition processes as shown in FIGS. 3 through 14 are performed to form stacked layers 44, as shown in FIG. 31. In accordance with some embodiments, as aforementioned in preceding paragraphs, the tilt angle θ may be greater than about 91°, for example, in the range between about 91° and about 110°. Tilt angle θ may also be greater than about 110°. It is appreciated that the stacked layers 44 in FIG. 14 and the stacked layer 44' as shown in FIG. 27 may also have the tilt angle θ as shown in FIG. 29 or 31.

Figure 32:
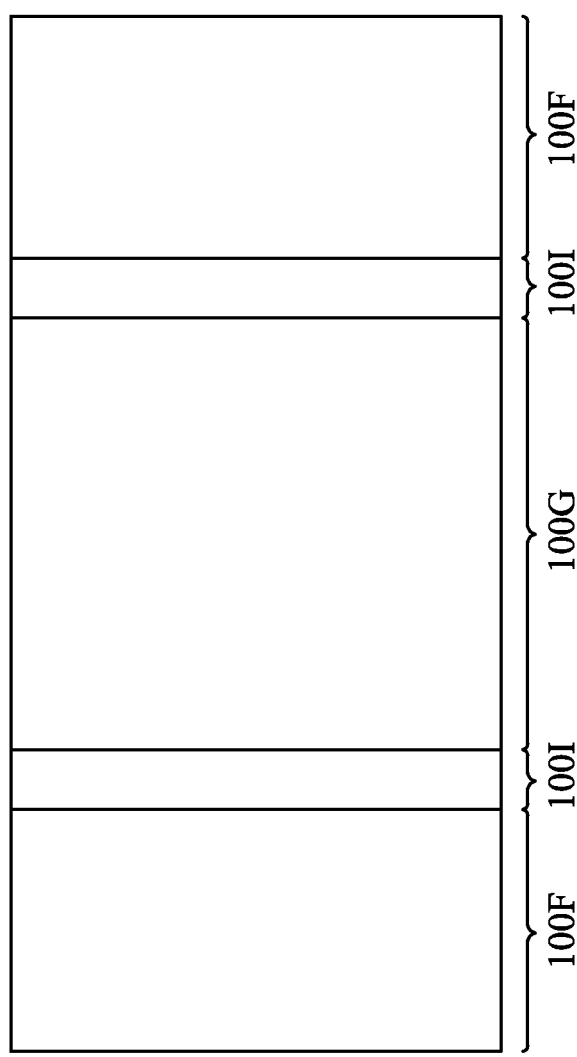
FIG. 32 schematically illustrates the different device regions and the interface regions in accordance with some embodiments.

FIG. 32 illustrates a top view of some regions including GAA region 110G, FinFET regions 100F, and interface regions 100I. GAA region 110G is used for forming a GAA transistor (for example, similar to GAA transistor 52 in FIGS. 18A, 18B-1 and 18B-2). The top view in FIG. 32 may reflect the top view of the structure shown in FIGS. 18A, 18B-1 and 18B-2. FinFET regions 110F are used for having FinFETs (for example, FinFETs 58 in FIGS. 18A, 18B-1 and 18B-2). Interface regions 100I may include the slant-edge regions 100I in FIG. 29 or 31 and the regions for providing process margin. As can be realized, if the stacked layers are conformal layers having vertical portions, the vertical portions are also in the interface regions. Accordingly, by forming stacked layers in trenches with the vertical portions removed, the interface regions 100I may be minimized.

Figure 33:
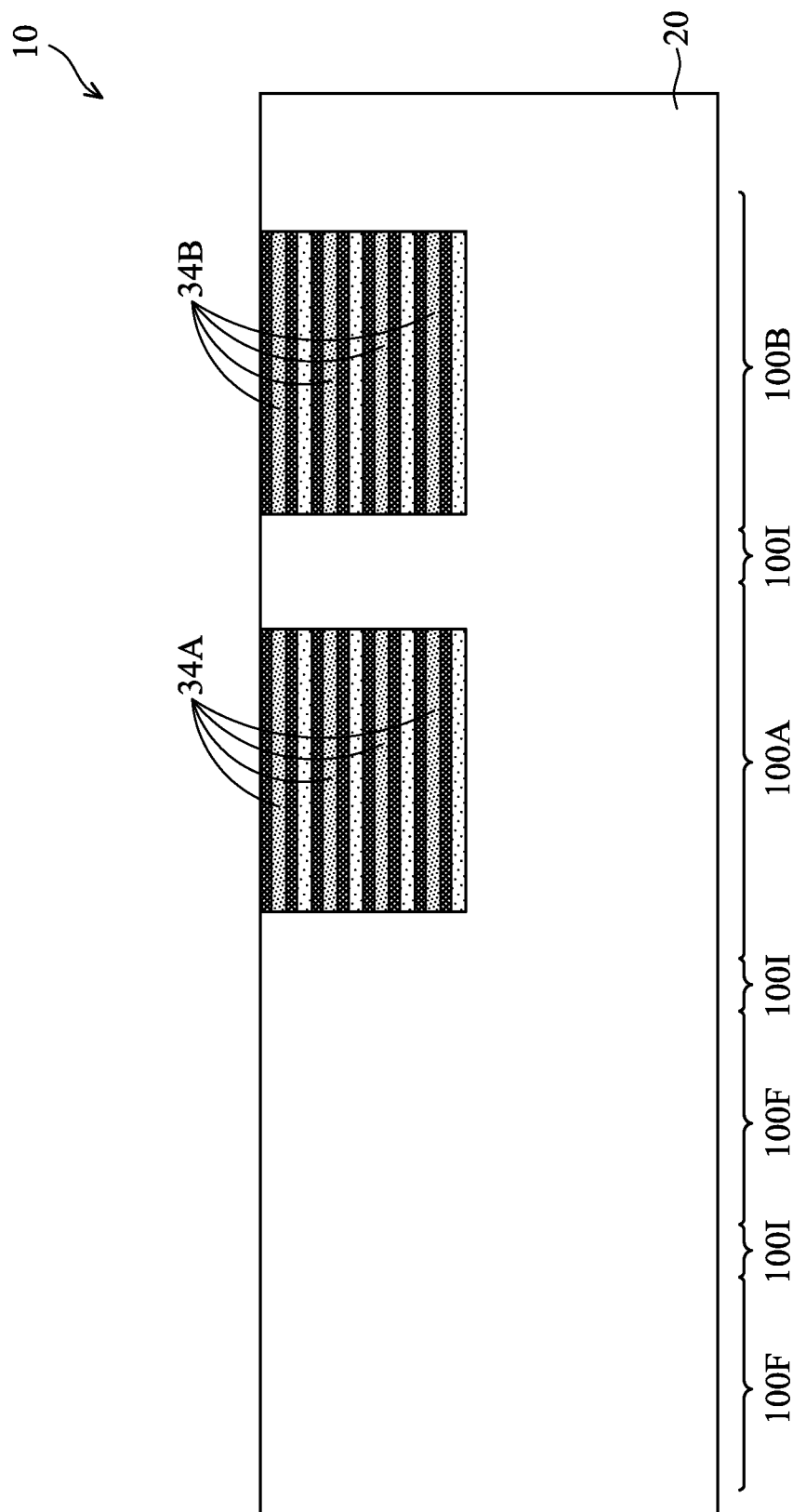
FIG. 33 schematically illustrates the different device regions for forming different types of devices and the interface regions in accordance with some embodiments.

FIG. 33 illustrates some portions of a wafer 10, which may include a plurality of regions. For example, there may be a plurality of (such as 2, 3, . . . up to 10 or more) single-channel transistor regions 100F, with the transistors therein having designs different from each other. There may be a plurality of (such as 2, 3, or more) multi-channel transistor regions (such as the GAAs with a plurality of channel layers), with the transistors therein having designs different from each other. For example, FIG. 33 illustrates that the channel layers in GAA regions 100A and 100B have their channel semiconductor layers 34A and 34B formed of different materials. The single-channel transistors may have different channel materials, different channel widths, or the like. Interface regions 100I separate the multiple device regions. By adopting the embodiments of the present disclosure, the interface regions between the device regions are smaller, and the density of devices may be increased.

It is appreciated that although in the example embodiments, semiconductor layers 24 and 34 are both formed of semiconductor materials, the embodiments may be applied on the formation of stacked layers formed of any other types of materials. For example, each of layers 24 and 34 may be formed of a material selected from semiconductor materials, dielectric material, metals or metal alloys, non-metal conductive materials, or the like. By adopting the embodiments of the present disclosure, stacked layers with horizontal portions but do not have vertical portions may be formed in trenches.

The embodiments of the present disclosure have some advantageous features. In the formation of stacked layers, the vertical portions of the stacked layers are selectively removed. By removing the vertical portions of the stacked layers, the chip area occupied by the stacked layers is reduced, and the interface regions between different types of devices are smaller. The resulting devices may have a high density.

In accordance with some embodiments of the present disclosure, a method includes etching a semiconductor substrate to form a trench, wherein the semiconductor substrate comprises a sidewall facing the trench; depositing a first semiconductor layer extending into the trench, wherein the first semiconductor layer comprises a first bottom portion at a bottom of the trench, and a first sidewall portion on the sidewall of the semiconductor substrate; removing the first sidewall portion to reveal the sidewall of the semiconductor substrate; depositing a second semiconductor layer extending into the trench, wherein the second semiconductor layer comprises a second bottom portion over the first bottom portion, and a second sidewall portion contacting the sidewall of the semiconductor substrate; and removing the second sidewall portion to reveal the sidewall of the semiconductor substrate. In an embodiment, the first semiconductor layer and the second semiconductor layer are formed of different semiconductor materials. In an embodiment, the removing the first sidewall portion comprises performing a passivation process on the first semiconductor layer; and after the passivation process, performing an isotropic etching process on the first semiconductor layer. In an embodiment, the passivation process comprises an anisotropic passivation process on the first semiconductor layer. In an embodiment, the passivation process results in a top surface layer of the first semiconductor layer to be converted into a passivation layer, and in the isotropic etching process, the passivation layer protects the first bottom portion from being removed. In an embodiment, the removing the first sidewall portion comprises performing an isotropic etching process on the first semiconductor layer using a process gas, wherein when the removing is started, both of the first bottom portion and the first sidewall portion are exposed to the process gas. In an embodiment, the process gas comprises an etching gas configured to etch the first semiconductor layer; and a byproduct-generating gas configured to generate a byproduct. In an embodiment, in the isotropic etching process, a byproduct layer is generated on a top surface of the first bottom portion to protect the first bottom portion from being etched. In an embodiment, the method further includes patterning the first semiconductor layer and the second semiconductor layer to form a patterned layer-stack; removing the first semiconductor layer; and forming a gate dielectric comprising portions contacting both of a top surface and a bottom surface of the second semiconductor layer.

In accordance with some embodiments of the present disclosure, a method includes forming a trench extending into a substrate; depositing a first layer comprising portions extending into the trench, wherein the first layer comprises first horizontal portions; and a first vertical portion in the trench and contacting a sidewall of the substrate; performing a first anisotropic treatment process to form a passivation layer on the first horizontal portions of the first layer; and performing a first isotropic etching process to remove the first vertical portion of the first layer. In an embodiment, the depositing the first layer comprises an epitaxy process to grow a material selected from the group consisting of silicon, germanium, and combinations thereof. In an embodiment, the first anisotropic treatment process comprises a plasma treatment process using a process gas selected from the group consisting of nitrogen ($N_2$), oxygen ($O_2$), $SO_2$, $CH_4$, $CO_2$, CO, $SiCl_4$, and combinations thereof. In an embodiment, the method further includes depositing a second layer over and contacting the passivation layer. In an embodiment, the second layer comprises additional portions extending into the trench, and wherein the second layer comprises second horizontal portions; and a second vertical portion in the trench and contacting the sidewall of the substrate.

In accordance with some embodiments of the present disclosure, a method includes etching a semiconductor substrate to form a trench; growing a first semiconductor layer comprising a first bottom portion at a bottom of the trench; and a first sidewall portion in the trench and contacting a sidewall of the semiconductor substrate; forming a first passivation layer at the bottom of the trench and over the first bottom portion of the first semiconductor layer; and etching the first sidewall portion of the first semiconductor layer, with the first bottom portion being left after the first sidewall portion is etched. In an embodiment, when the first passivation layer is formed at the bottom of the trench, the first passivation layer is not formed on the first sidewall portion of the first semiconductor layer. In an embodiment, when the first passivation layer is formed at the bottom of the trench, an extension portion of the first passivation layer is formed on the first sidewall portion of the first semiconductor layer, and the extension portion is thinner than the first passivation layer at the bottom of the trench. In an embodiment, the method further includes growing a second semiconductor layer including a second bottom portion at the bottom of the trench and over the first passivation layer; and a second sidewall portion in the trench; forming a second passivation layer at the bottom of the trench and over the second bottom portion of the second semiconductor layer; and etching the second sidewall portion of the second semiconductor layer. In an embodiment, the method further includes removing the first bottom portion of the first semiconductor layer. In an embodiment, the method further includes removing the first passivation layer and the second passivation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a first semiconductor layer, wherein the first semiconductor layer comprises:
a first bottom portion at a bottom of a trench in a semiconductor substrate; and
a first sidewall portion on a sidewall of the semiconductor substrate, with the sidewall of the semiconductor substrate facing the trench;
passivating the first semiconductor layer to form a first dielectric layer on a first remaining portion of the first semiconductor layer;
depositing a second semiconductor layer over the first dielectric layer, wherein the first semiconductor layer and the second semiconductor layer are formed of different semiconductor materials; and
passivating the second semiconductor layer to form a second dielectric layer over a second remaining portion of the second semiconductor layer.

2. The method of claim 1, wherein the passivating the first semiconductor layer results in both of a horizontal portion and a vertical portion of the first semiconductor layer to be partially converted into the first dielectric layer.

3. The method of claim 2, wherein the first dielectric layer comprises an additional horizontal portion at the bottom of the trench, and an additional vertical portion on the sidewall of the semiconductor substrate, wherein the additional vertical portion is thinner than the horizontal portion.

4. The method of claim 1, wherein the depositing the first semiconductor layer comprises depositing silicon germanium or carbon-doped silicon, and the depositing the second semiconductor layer comprises depositing silicon.

5. The method of claim 1 further comprising patterning the first semiconductor layer, the first dielectric layer, the second semiconductor layer, and the second dielectric layer to form stacked layers.

6. The method of claim 5 further comprising etching horizontal portions of the stacked layers and some portions of the semiconductor substrate on opposing sides of the stacked layers to form additional trenches, wherein the additional trenches extend lower than the stacked layers.

7. The method of claim 5 further comprising forming a gate-all-around transistor based on the stacked layers, wherein a remaining portion of the second semiconductor layer acts as a channel region of the gate-all-around transistor.

8. The method of claim 1 further comprising, before the second semiconductor layer is deposited, removing a part of the first semiconductor layer to reveal the sidewall of the semiconductor substrate.

9. The method of claim 8, wherein the removing the part of the first semiconductor layer comprises an isotropic etching process.

10. A method comprising:
forming a trench extending into a substrate;

depositing a first semiconductor layer comprising portions extending into the trench, wherein the first semiconductor layer comprises a first horizontal portion;

performing a first anisotropic treatment process to form a first passivation layer on the first semiconductor layer, wherein the first anisotropic treatment process converts a top portion of the first semiconductor layer into the first passivation layer; depositing a second semiconductor layer on the first passivation layer, wherein the first semiconductor layer and the second semiconductor layer comprise different semiconductor materials; and performing a second anisotropic treatment process to form a second passivation layer on the second semiconductor layer.

11. The method of claim 10, wherein a top surface of the second passivation layer is lower than an additional top surface of the substrate.

12. The method of claim 10 further comprising patterning the first semiconductor layer, the first passivation layer, the second semiconductor layer, and the second passivation layer to form stacked layers.

13. The method of claim 12 further comprising:
removing portions of the first semiconductor layer, the first passivation layer, and the second passivation layer from the stacked layers; and
forming a gate stack comprising a higher portion overlapping a remaining portion of the second semiconductor layer, and a lower portion overlapped by the remaining portion of the second semiconductor layer.

14. The method of claim 12, wherein the patterning results in the substrate to be etched, so that trenches are formed on opposing sides of the stacked layers, and wherein bottoms of the trenches are lower than a bottommost surface of the stacked layers.

15. The method of claim 14 further comprising:
forming dielectric isolation regions filling the trenches; and
recessing the dielectric isolation region so that the stacked layers are higher than top surfaces of remaining portions of the dielectric isolation regions.

16. The method of claim 10, wherein each of the first anisotropic treatment process and the second anisotropic treatment process is performed using a process gas selected from the group consisting of nitrogen ($N_2$), oxygen ($O_2$), $SO_2$, $CH_4$, $CO_2$, CO, $SiCl_4$, and combinations thereof.

17. A method comprising:
repeating a plurality of cycles to form stacked layers extending into a trench in a substrate, wherein each of the plurality of cycles comprises:
growing a first semiconductor layer comprising:
a first bottom portion in the trench; and
a sidewall portion in the trench, wherein a bottom end of the sidewall portion is joined to an end of the first bottom portion;
forming a first passivation layer comprising a second bottom portion overlapping the first bottom portion; and
growing a second semiconductor layer over the first passivation layer; and
forming a second passivation layer over the second semiconductor layer; and
patterning the stacked layers.

18. The method of claim 17 further comprising performing a planarization process to level top surfaces of the substrate and the stacked layers.

19. The method of claim 18, wherein the stacked layers are patterned after the planarization process.

20. The method of claim 18, further comprising forming a gate-all-around transistor, wherein the second semiconductor layers formed by the plurality of cycles act as channel regions of the gate-all-around transistor.

\* \* \* \* \*